US010613579B2

(12) United States Patent
Wang et al.

(10) Patent No.: US 10,613,579 B2
(45) Date of Patent: *Apr. 7, 2020

(54) AUTOMOTIVE DISPLAY DEVICE

(71) Applicant: SAMSUNG DISPLAY CO., LTD., Yongin-si, Gyeonggi-do (KR)

(72) Inventors: Seong Min Wang, Yongin-si (KR); MuGyeom Kim, Yongin-si (KR); Soo Youn Kim, Yongin-si (KR); Hyeonjeong Sang, Yongin-si (KR); Jae Won Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/261,799

(22) Filed: Jan. 30, 2019

(65) Prior Publication Data

US 2019/0163232 A1 May 30, 2019

Related U.S. Application Data

(63) Continuation of application No. 14/852,643, filed on Sep. 14, 2015, now Pat. No. 10,222,825.

(30) Foreign Application Priority Data

Mar. 2, 2015 (KR) .......................... 10-2015-0029205

(51) Int. Cl.
*G06F 1/16* (2006.01)
*B60R 11/02* (2006.01)
(Continued)

(52) U.S. Cl.
CPC ............ *G06F 1/1601* (2013.01); *B60K 35/00* (2013.01); *B60K 37/06* (2013.01);
(Continued)

(58) Field of Classification Search
USPC .................................................. 361/749, 748
See application file for complete search history.

(56) References Cited

U.S. PATENT DOCUMENTS 5,463,827 A * 11/1995 Williams ................ G09F 9/375
40/449
6,663,155 B1 12/2003 Malone et al.
(Continued)

FOREIGN PATENT DOCUMENTS

CN 101685796 A 3/2010
CN 104219471 A 12/2014
(Continued)

OTHER PUBLICATIONS

European Search Report dated Oct. 10, 2016 in Corresponding European Patent Application No. 16157428.0.
(Continued)

*Primary Examiner* — Andargie M Aychillhum
(74) *Attorney, Agent, or Firm* — Kile Park Reed & Houtteman PLLC

(57) ABSTRACT

An automotive display device on which an image may be displayed, the automotive display device being for a vehicle interior, the automotive display device including an automotive frame, at least part of the automotive frame being bendable; and a bending controller to control bending of the automotive frame.

16 Claims, 22 Drawing Sheets

(51) Int. Cl.
    *G09F 9/30*         (2006.01)
    *G09F 21/04*       (2006.01)
    *B60K 37/06*       (2006.01)
    *B60K 35/00*       (2006.01)
    *H05K 5/00*         (2006.01)
    *H05K 5/02*         (2006.01)
    *G02F 1/1333*      (2006.01)
    *B60R 11/00*       (2006.01)

(52) U.S. Cl.
    CPC .......... *B60R 11/0235* (2013.01); *G09F 9/301* (2013.01); *G09F 21/04* (2013.01); *H05K 5/0017* (2013.01); *H05K 5/0021* (2013.01); *H05K 5/0217* (2013.01); *B60K 2370/1438* (2019.05); *B60K 2370/1533* (2019.05); *B60K 2370/20* (2019.05); *B60K 2370/67* (2019.05); *B60K 2370/774* (2019.05); *B60R 2011/0007* (2013.01); *G02F 1/13338* (2013.01); *G02F 1/133305* (2013.01); *G02F 1/133308* (2013.01); *G09G 2380/02* (2013.01); *G09G 2380/10* (2013.01)

(56) References Cited

U.S. PATENT DOCUMENTS

| | | | |
|---|---|---|---|
| 7,136,115 B2 | 11/2006 | Chen | |
| 8,891,027 B2 | 11/2014 | Chen | |
| 9,457,642 B2* | 10/2016 | Kothari | B60R 1/00 |
| 2003/0162312 A1* | 8/2003 | Takayama | H01L 21/76251 438/22 |
| 2011/0137521 A1* | 6/2011 | Levi | B60N 2/002 701/36 |
| 2012/0268665 A1* | 10/2012 | Yetukuri | B60K 35/00 348/837 |
| 2013/0021762 A1 | 1/2013 | Van Dijk et al. | |
| 2013/0215041 A1 | 8/2013 | Kim et al. | |
| 2013/0241720 A1 | 9/2013 | Ricci et al. | |
| 2014/0285449 A1 | 9/2014 | Cho et al. | |
| 2014/0354791 A1 | 12/2014 | Lee et al. | |
| 2017/0083047 A1 | 3/2017 | Hélot et al. | |

FOREIGN PATENT DOCUMENTS

| | | |
|---|---|---|
| EP | 1 245 429 A2 | 10/2002 |
| EP | 1 666 307 A1 | 6/2006 |
| EP | 3 215 391 A | 9/2017 |
| JP | 05-024485 A | 2/1993 |
| JP | 2005-349977 A | 12/2005 |
| JP | 2011-183916 A | 9/2011 |
| KR | 1999-0071047 A | 9/1999 |
| KR | 10-0522808 B1 | 10/2005 |
| KR | 10-2005-0109700 A | 11/2005 |
| KR | 10-0593489 B1 | 6/2006 |
| KR | 10-2006-0105307 A | 10/2006 |
| KR | 10-2007-0014816 A | 2/2007 |
| KR | 10-2007-0069548 A | 7/2007 |
| KR | 10-0787306 B1 | 12/2007 |
| KR | 10-2010-0012945 A | 2/2010 |
| KR | 10-2010-0052227 A | 5/2010 |
| KR | 10-2010-0056681 A | 5/2010 |
| KR | 20-0452278 Y1 | 2/2011 |
| KR | 10-2011-0038560 A | 4/2011 |
| KR | 10-1043656 B1 | 6/2011 |
| KR | 10-2011-0081578 A | 7/2011 |
| KR | 10-2011-0128613 A | 11/2011 |
| KR | 10-2013-0013149 A | 2/2013 |
| KR | 10-1331827 B1 | 11/2013 |
| KR | 10-2014-0059274 A | 5/2014 |
| KR | 10-2014-0095347 A | 8/2014 |
| KR | 10-2015-0107975 A | 9/2015 |
| WO | WO 2014/148688 A1 | 9/2014 |

OTHER PUBLICATIONS

Examination Report dated Mar. 21, 2019 from the China Patent Office in respect of the Chinese Patent Application No. 201610104680.0.

\* cited by examiner

AUTOMOTIVE DISPLAY DEVICE

CROSS-REFERENCE TO RELATED APPLICATIONS

This is a continuation application based on pending application Ser. No. 14/852,643, filed Sep. 14, 2015, the entire contents of which is hereby incorporated by reference.

Korean Patent Application No. 10-2015-0029205, filed on Mar. 2, 2015, in the Korean Intellectual Property Office, and entitled: "Automotive Display Device," is incorporated by reference herein in its entirety.

BACKGROUND

1. Field

The present disclosure relates to an automotive display device.

2. Description of the Related Art

Vehicles may not only be a means of transportation but also a space to enjoy one's time. Various display devices may be mounted on or in vehicles. With display devices, users may, for example, receive real-time traffic information, send and receive e-mails, get information via internet, use a remote diagnostic service for a passenger in the vehicle or the car itself, listen to music, play on-line games, and watch television (TV) and movies.

SUMMARY

Embodiments may be realized by providing an automotive display device on which an image may be displayed, the automotive display device being for a vehicle interior, the automotive display device including an automotive frame, at least part of the automotive frame being bendable; and a bending controller to control bending of the automotive frame.

The automotive frame may include a display that is bendable, the flexible display to display the image, the bending controller controlling bending of the flexible display; and a non-display frame that is bendable, the non-display frame not displaying the image.

The flexible display may include a flexible display panel to display the image; and a touch screen panel on the flexible display panel to sense a touch or proximity touch.

The non-display frame may be maintained in a bent state.

The non-display frame may be unbent when the flexible display is unbent.

A first end of the flexible display may contact the non-display frame and a second end of the flexible display may be spaced apart from the non-display frame when the flexible display is unbent with respect to a bending axis.

The flexible display may display the image at one or more of a state when the flexible display is bent with respect to the bending axis and a state when the flexible display is unbent with respect to the bending axis.

The automotive frame may cover an accommodating part between a plurality of seats.

The automotive frame may sense a user's touch, a user's proximity touch, an object's touch, or an object's proximity touch to display a control unit image controlling the image.

The flexible display may include a first flexible display that is bendable; and a second flexible display spaced apart from the first flexible display, the second flexible display being bendable A first end of the first flexible display may contact the non-display frame and a second end of the first flexible display may be spaced apart from the non-display frame when the first flexible display is unbent with respect to a first bending axis.

The second flexible display may be maintained in a bent state.

The first flexible display may have a first radius of curvature and the second flexible display may have a second radius of curvature different from the first radius of curvature.

The first flexible display may display a first display image, and the first flexible display may include a separation area spaced apart from the non-display frame when the first flexible display is unbent, the separation area displaying the first display image; and a fixing area contacting the non-display frame when the first flexible display is unbent, the fixing area displaying at least one of the first display image and a first control image controlling the first display image.

The flexible display may further include a third flexible display spaced apart from each of the first and second flexible displays.

The third flexible display may be bendable.

The third flexible display may have a third radius of curvature.

A first end of the third flexible display may contact the non-display frame and a second end of the third flexible display may be spaced apart from the non-display frame when the third flexible display is unbent with respect to a second bending axis.

At least one of the first flexible display, the second flexible display, and third flexible display may be maintained in a bent state.

Embodiments may be realized by providing an automotive display device, including a flexible display that is bendable, the flexible display in a vehicle to display an image; and a non-display frame that is bendable, the non-display frame in the vehicle to surround the flexible display.

The flexible display may display the image when the flexible display is unbent.

The non-display frame may be fixed inside the vehicle.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
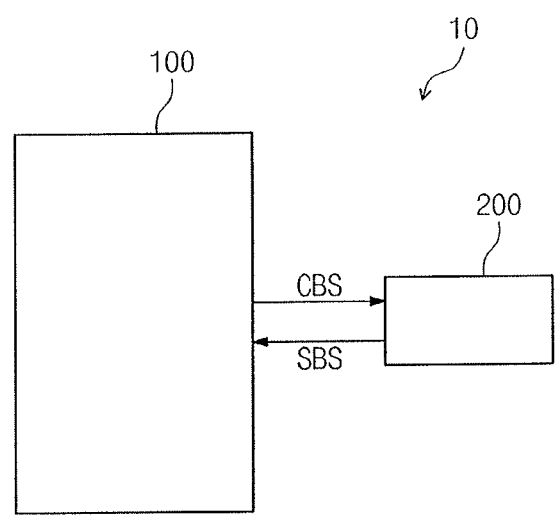
FIG. 1 illustrates a block diagram of an automotive display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an automotive display device 10 according to an exemplary embodiment of the present disclosure.

Referring to FIG. 1, the automotive display device 10 may be applied to a vehicle, such as a bike, motorcycle, car, ship, or plane. The automotive display device 10 may be formed on at least one element of the vehicle or coupled to at least one element of the vehicle. Hereinafter, the automotive display device 10 applied to the car will be described in detail as a representative example.

The automotive display device 10 may include an automotive frame 100 and a bending controller 200. The automotive frame 100 may be applied to the vehicle and may be bent. The automotive frame 100 may be placed between seats. For example, in an embodiment, the automotive frame 100 may be disposed between a driver seat and a passenger seat.

Figure 2A:
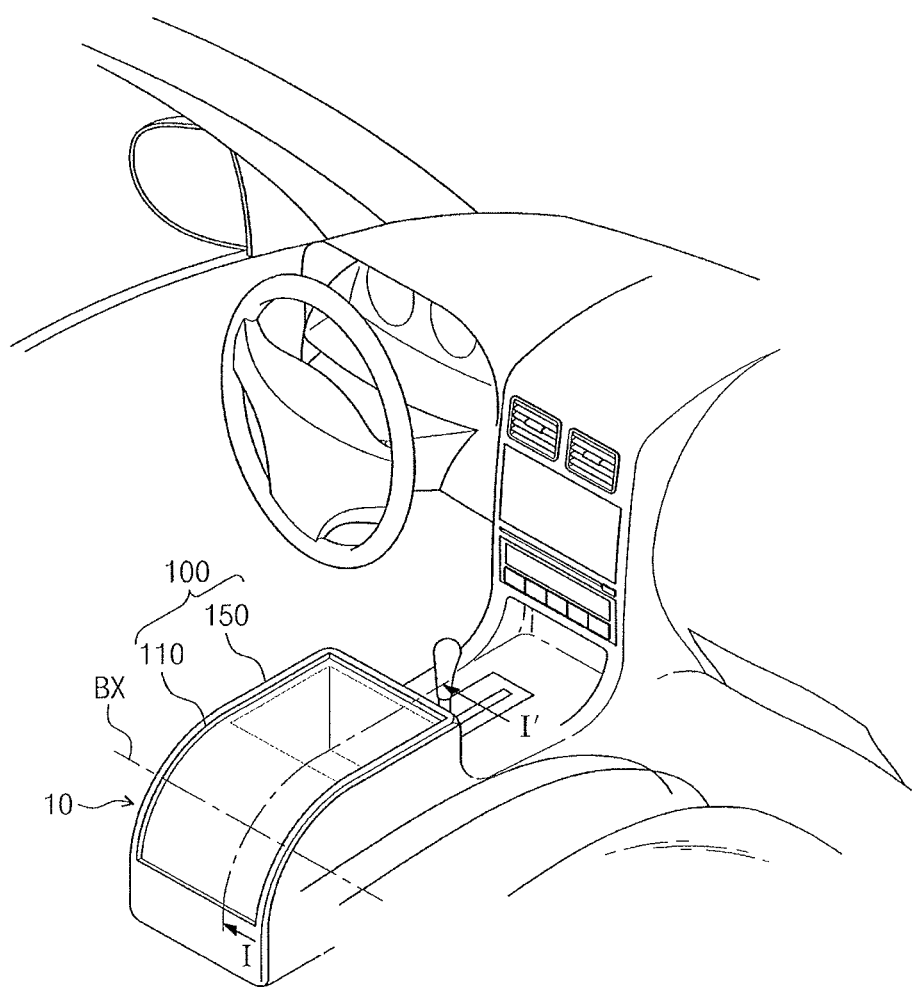
FIG. 2A illustrates a perspective view of an automotive display device according to an exemplary embodiment of the present disclosure.

The automotive frame 100 may include a flexible display device 110 (refer to FIG. 2A) and a non-display frame 150 (refer to FIG. 2A). The automotive frame 100 will be described again in detail.

The bending controller 200 may control the bending of the automotive frame 100. For example, the bending controller 200 may control the bending of the flexible display device 110 (refer to FIG. 2A).

The bending controller 200 may apply a bending control signal SBS to the automotive frame 100 to unbend the automotive frame 100. The automotive frame 100 may apply a completion signal CBS after being unbent.

The bending controller 200 may apply the bending control signal SBS to the unbent automotive frame 100 to bend the automotive frame 100 again. The automotive frame 100 may be bent, and then may apply the completion signal to the bending controller 200 again.

Figure 2B:
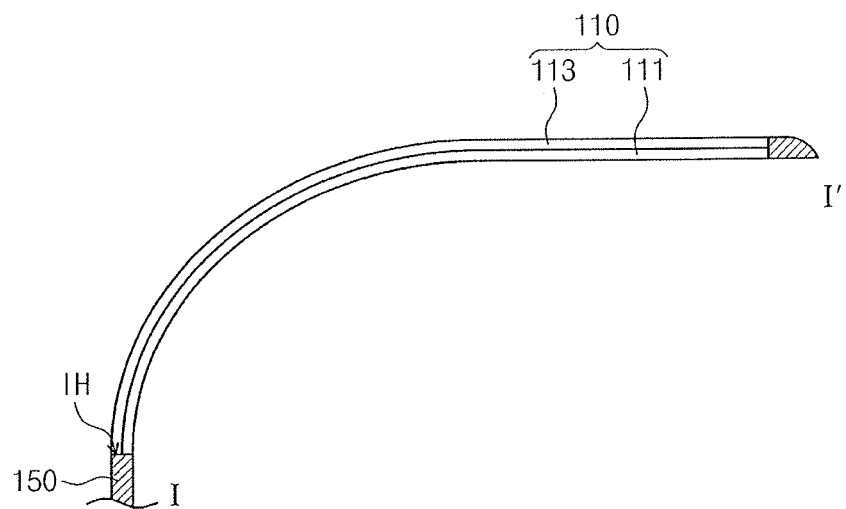
FIGS. 2B and 2C illustrate cross-sectional views each taken along a line I-I' of FIG. 2A.
Figure 2C:
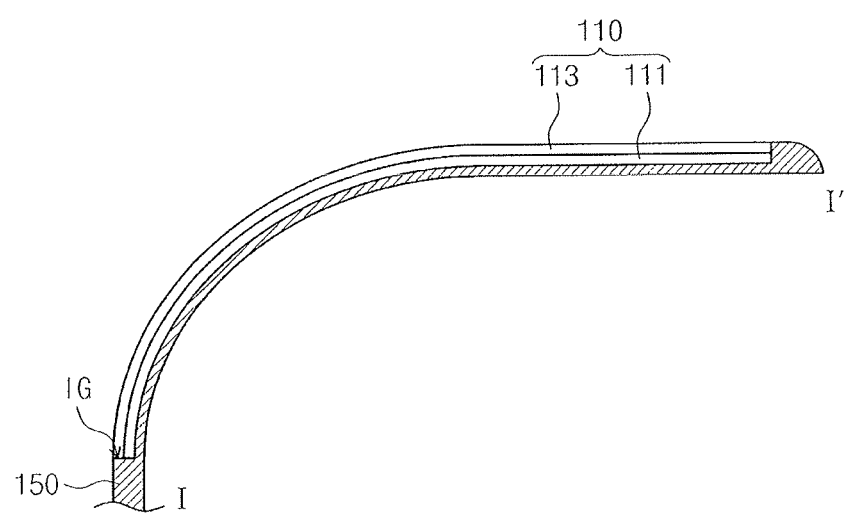

FIG. 2A illustrates a perspective view of an automotive display device according to an exemplary embodiment of the present disclosure and FIGS. 2B and 2C illustrate cross-sectional views each taken along a line I-I' of FIG. 2A.

Referring to FIGS. 2A to 2G, the automotive frame 100 may include the flexible display device 110 and the non-display frame 150. The non-display frame 150 may be provided bent and may not display an image. The non-display frame 150 may surround the flexible display device 110. The non-display frame 150 may be partially transparent.

The automotive frame 100 may cover an accommodating part provided between the seats. The accommodating part may be a console box or an armrest-type accommodating part. The automotive frame 100 may be a cover for the accommodating part or formed on a cover of the accommodating part.

The flexible display device 110 may include a flexible display panel 111 and a touch screen panel 113. The flexible display panel 111 may be, in an embodiment, an organic light emitting display panel, a liquid crystal display panel, an electrophoretic display panel, or an electrowetting display panel. The flexible display panel 111 may be a two- or three-dimensional display panel.

In an embodiment, the flexible display panel 111 may be transparent to allow a user to see an object disposed above or under the flexible display panel 111. For example, the flexible display panel 111 may be a transparent flexible display panel, e.g., a transparent organic light emitting display panel or a transparent liquid crystal display panel. Since the flexible display panel 111 is transparent, objects accommodated in the accommodating part may be visible.

The touch screen panel 113 may be disposed on the flexible display panel 111. The touch screen panel 113 may recognize a user's touch, a user's proximity touch, an object's touch, or an object's proximity touch. The term "proximity touch" used herein means that the touch screen panel 113 may recognize the touch since the user or the object may be in a distance range recognized by the touch screen panel 113 even though the user or the object may not directly touch the touch screen panel 113.

The non-display frame 150 may surround the flexible display device 110. Referring to FIG. 2B, the non-display frame 150 may include a hole IH and the flexible display device 110 may be disposed in the hole IH of the non-display frame 150.

The non-display frame 150 may include a first non-display frame surrounding the flexible display device 110 and a second non-display frame connected and fixed to the element of the vehicle. For example, the second non-display frame may contact at least one side surface of the first non-display frame. The second non-display frame may surround the first non-display frame. When the flexible display device 110 is unbent, the first non-display frame may be bent.

In an embodiment, the non-display frame 150 may have substantially the same thickness as that of the flexible display device 110. The thickness of the non-display frame 150 may be different from the thickness of the flexible display device 110.

Figure 3A:
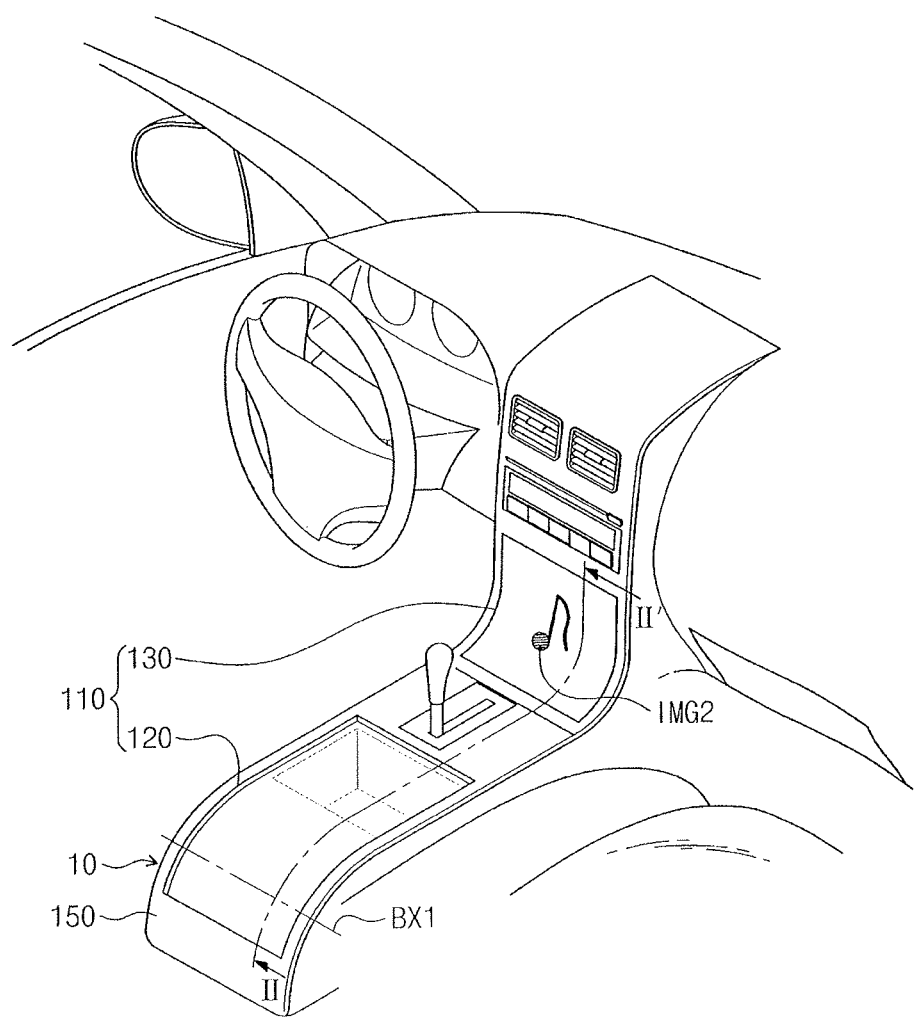
FIG. 3A illustrates a perspective view of an automotive display device according to an exemplary embodiment of the present disclosure.
Figure 3B:
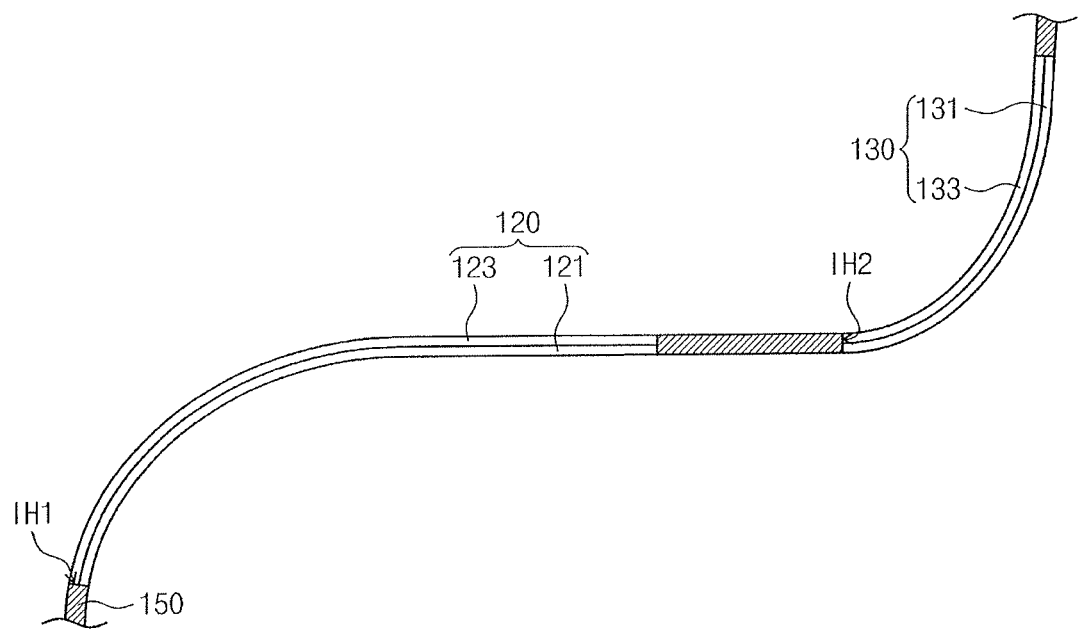
FIGS. 3B and 3C illustrate cross-sectional views each taken along a line II-II' of FIG. 3A.
Figure 3C:
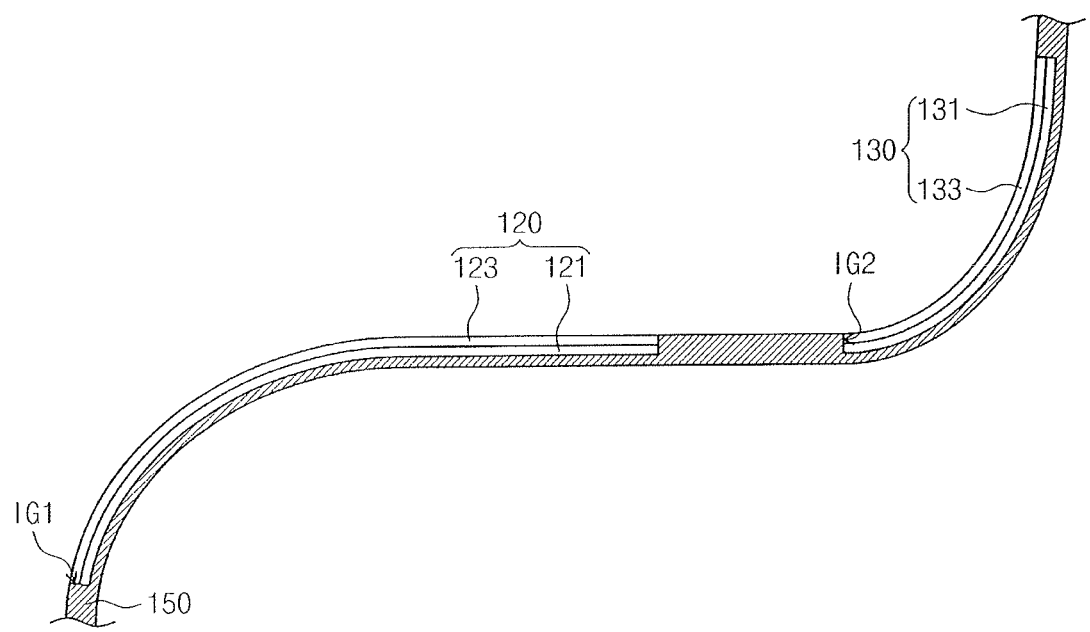

Referring to FIG. 3C, the non-display frame 150 may include a groove IG and the flexible display device 110 may be inserted into the groove IG of the non-display frame 150. In FIG. 2C, the flexible display device 110 may be completely inserted into the groove IG. According to embodiments, the flexible display device 110 may be partially inserted into the groove IG.

In FIGS. 2B and 2C, the thickness of the flexible display panel 111 may be substantially the same as the thickness of the touch screen panel 113. According to embodiments, the thickness of the flexible display panel 111 may be different from the thickness of the touch screen panel 113.

Figure 2D:
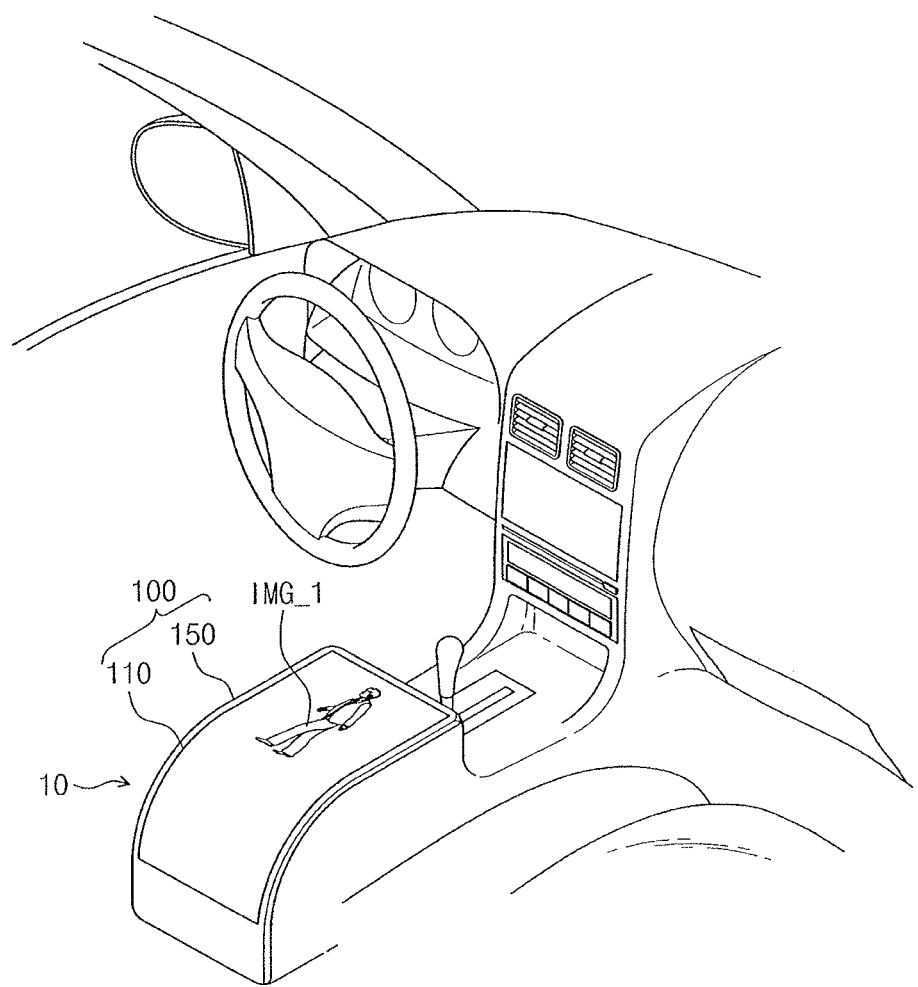
FIGS. 2D, 2E, 2F, and 2G illustrate perspective views of an automotive display device according to an exemplary embodiment of the present disclosure.
Figure 2E:
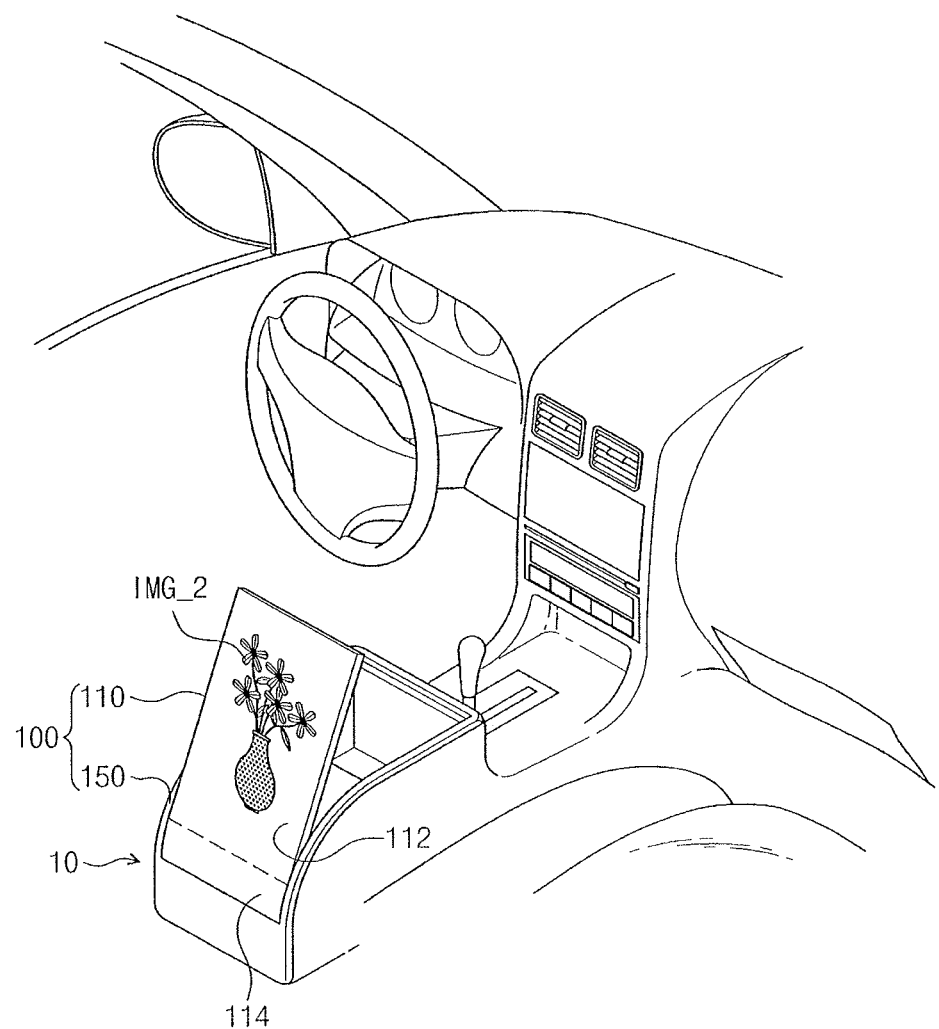
Figure 2F:
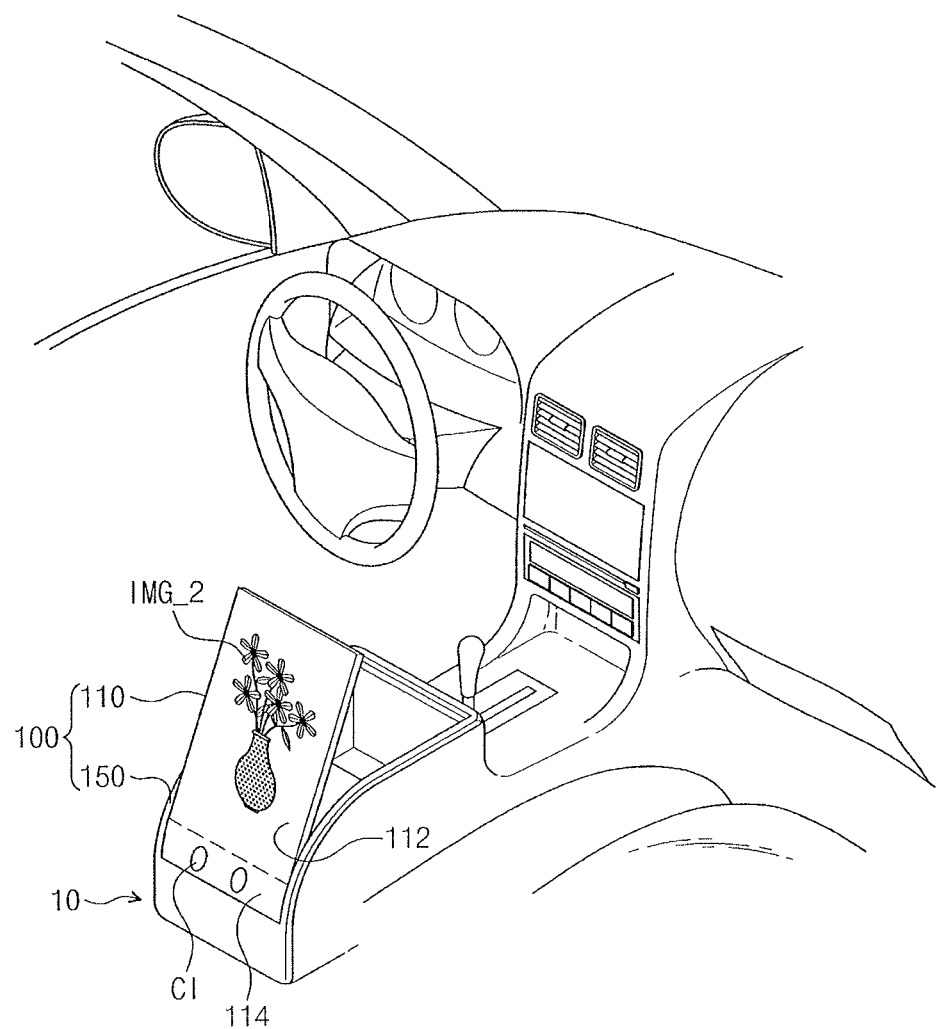
Figure 2G:
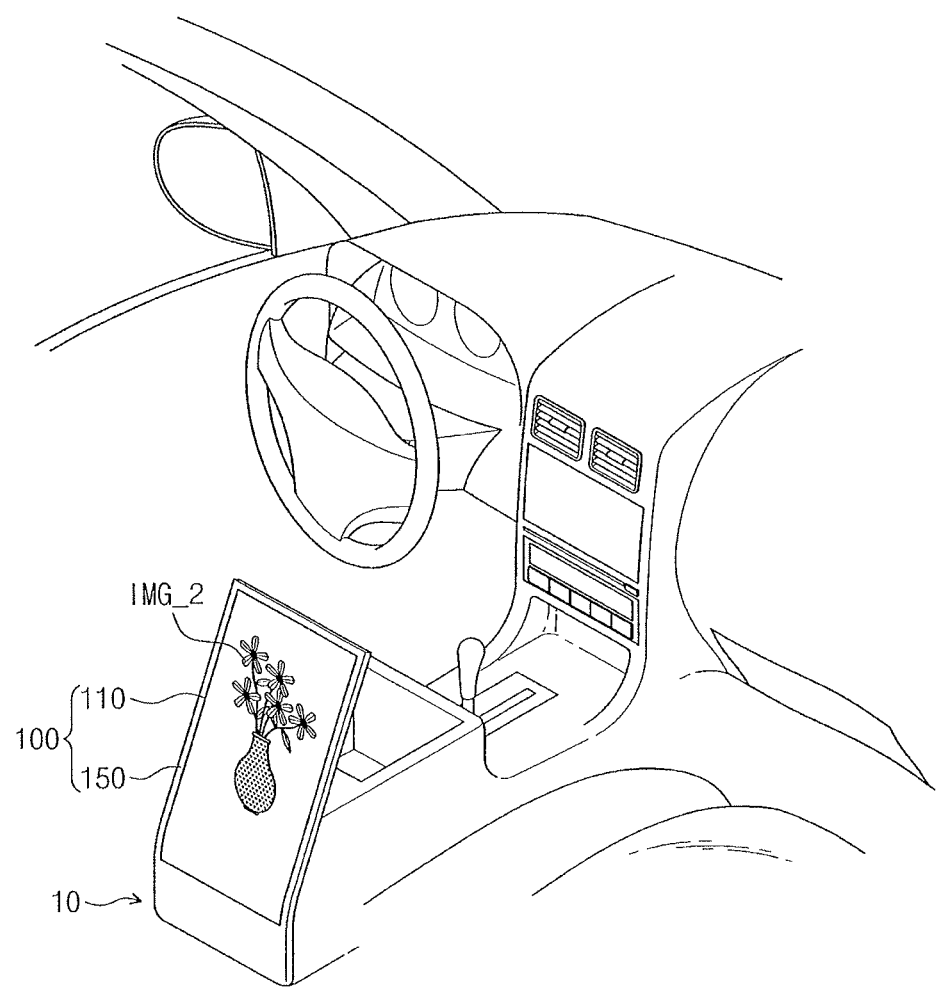

Referring to FIG. 2E, when the flexible display device 110 is unbent, the non-display frame 150 may not be unbent. In an embodiment, when the flexible display device 110 is unbent, the non-display frame 150 may be unbent as shown in FIG. 2G.

Referring to FIGS. 2A, 2D, 2E, 2F, and 2G, the flexible display device 110 may display images IMG_1 and IMG_2 at one or more of a state when the flexible display device 110 is bent with respect to a bending axis BX and a state when the flexible display device 110 is unbent with respect to the bending axis BX. Referring to FIG. 2D, the flexible display device 110 may display a first image IMG_1 when being bent with respect to the bending axis BX. The first image IMG_1 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

Referring to FIGS. 2A, 2E, 2F, and 2G, the flexible display device 110 may display a second image IMG_2 when being unbent with respect to the bending axis BX. The flexible display device 110 may display the image while being unbent. The second image IMG_2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie. The second image IMG_2 may be substantially the same as or may be different from the first image IMG_1.

Referring to FIGS. 2A and 2D, when the flexible display device 110 is bent, both ends of the flexible display device 110 may contact the non-display frame 150. Referring to FIGS. 2E and 2F, when the flexible display device 110 is unbent, one end of the flexible display device 110 may contact the non-display frame 150 and the other end of the flexible display device 110 may be spaced apart from the non-display frame 150 since the flexible display device 110 is unbent with respect to the bending axis BX (refer to FIG. 2A). In an embodiment, as shown in FIGS. 2C and 2D, the flexible display device 110 may be completely unbent to be flat between the seats. The flexible display device 110 may be partially unbent between the seats.

Referring to FIGS. 2E and 2F, when the user or object touches or proximity-touches the flexible display device 110, a control unit image CI used to control the image displayed through the flexible display device 110 may be displayed. According to embodiments, the control unit image CI may be displayed regardless of the touch or proximity touch.

The control unit image CI may be overlapped with the first image IMG_1 (refer to FIG. 2D) or the second image IMG_2 while being displayed. When the control unit image CI is overlapped with the first image IMG_1 (refer to FIG. 2D) or the second image IMG_2 while being displayed, a portion of the first image IMG_1 (refer to FIG. 2D), which is overlapped with the control unit image CI, and a portion of the second image IMG_2, which is overlapped with the control unit image CI, may become blurred.

The user may control sound, size, and contrast of the image displayed through the flexible display device 110 and the bending of the flexible display device 110 by directly operating the control unit image CI or operating the control unit image CI through a tool. The user may control not only the image displayed through the flexible display device 110, but also elements of the vehicle, e.g., a sun visor, a window, and a back mirror, through the control unit image CI.

The control unit image CI may be provided in a plural number. The control unit images CI may generate vibrations with different intensities.

In an embodiment, as showing in FIG. 2F, the control unit image CI may be displayed in the flexible display device 110. In an embodiment, a control unit having the same functions as those of the control unit image CI may be provided in the non-display frame 150 instead of the control unit image CI.

FIG. 3A illustrates a perspective view of an automotive display device according to an exemplary embodiment of the present disclosure and FIGS. 3B and 3C illustrate cross-sectional views each taken along a line II-II' of FIG. 3A.

Referring to FIGS. 3A to 3C, a flexible display device 110 may include a first flexible display device 120 and a second flexible display device 130. The first flexible display device 120 may be bent.

The first flexible display device 120 may include a first flexible display panel 121 and a first touch screen panel 123. The first flexible display panel 121 may be transparent to allow a user to see an object disposed above or under the first flexible display panel 121. According to embodiments, the first flexible display panel 121 may not be transparent.

The first touch screen panel 123 may be disposed on the first flexible display panel 121. The first touch screen panel 123 may recognize a user's touch, a user's proximity touch, an object's touch, or an object's proximity touch.

The second flexible display device 130 may include a second flexible display panel 131 and a second touch screen panel 133. The second flexible display panel 131 may be transparent to allow a user to see an object disposed above or under the second flexible display panel 131. According to embodiments, the second flexible display panel 121 may not be transparent.

The second touch screen panel 133 may be disposed on the second flexible display panel 131. The second touch screen panel 133 may recognize the user's touch, the user's proximity touch, the object's touch, or the object's proximity touch.

According to FIGS. 3B and 3C, in an embodiment, the first and second flexible display devices 120 and 130 may include the first and second touch screen panels 123 and 133, respectively. In an embodiment, the first flexible display device 120 may not include the first touch screen panel 123 and the second flexible display device 130 may not include the second touch screen panel 133.

The non-display frame 150 may surround the first and second flexible display devices 120 and 130. In the present exemplary embodiment, the non-display frame 150 may be integrally formed as a single unit to surround the first and second flexible display devices 120 and 130. In an embodiment, the non-display frame 150 may include a plurality of sub-non-display frames, one sub-non-display frame of the sub-non-display frames may surround the first flexible display device 120, and the other sub-non-display frame of the sub-non-display frames may surround the second flexible display device 130. The sub-non-display frames may be connected to or separated from each other. When at least one of the first and second flexible display devices 120 and 130 is unbent, at least a portion of the sub-non-display frames may be unbent.

Referring to FIG. 3B, the non-display frame 150 may include a first hole IH1 and a second hole IH2, the first flexible display device 120 may be disposed in the first hole IH1, and the second flexible display device 130 may be disposed in the second hole IH2.

The non-display frame 150 may have substantially the same thickness as the first and second flexible display devices 120 and 130. At least one of the non-display frame 150, the first flexible display device 120, and the second flexible display device 130 may have a thickness different from those of others.

Referring to FIG. 3C, the non-display frame 150 may include a first groove IG1 and a second groove IG2. The first flexible display device 120 may be inserted into the first groove IG1 and the second flexible display device 130 may be inserted into the second groove IG2. In an embodiment, as shown in FIG. 3C, the first flexible display device 120 may be completely inserted into the first groove IG1 and the second flexible display device 130 may be completely inserted into the second groove IG2. In an embodiment, the first flexible display device 120 may be partially inserted into the first groove IG1 and the second flexible display device 130 may be partially inserted into the second groove IG2.

Referring to FIGS. 3B and 3C, the first and second flexible display devices 120 and 130 may be disposed in various ways different from that shown in FIGS. 3B and 3C. For example, the first flexible display device 120 may be disposed in the first hole IH1 and the second flexible display device 130 may be inserted into the second groove IG2. The first flexible display device 120 may be inserted into the first groove IG1 and the second flexible display device 130 may be disposed in the second hole IH2.

Figure 3D:
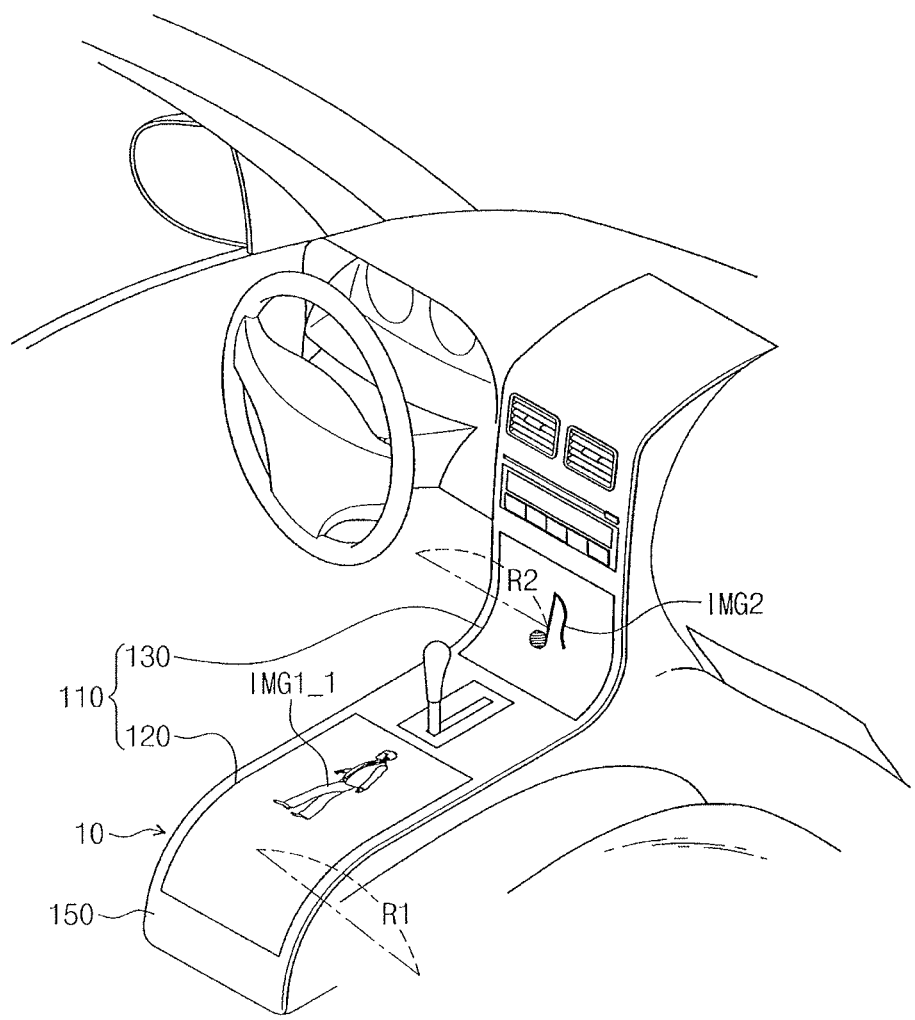
FIGS. 3D, 3E, and 3F illustrate perspective views of an automotive display device according to an exemplary embodiment of the present disclosure.
Figure 3E:
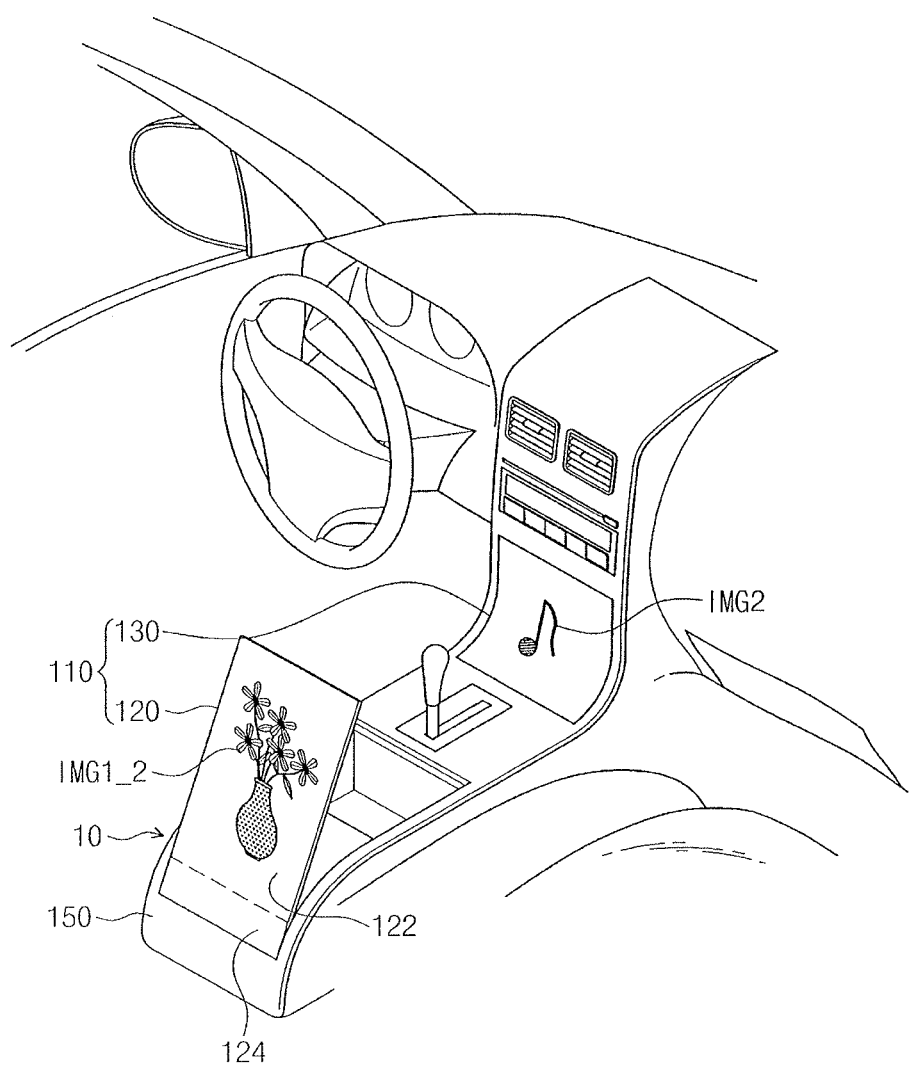
Figure 3F:
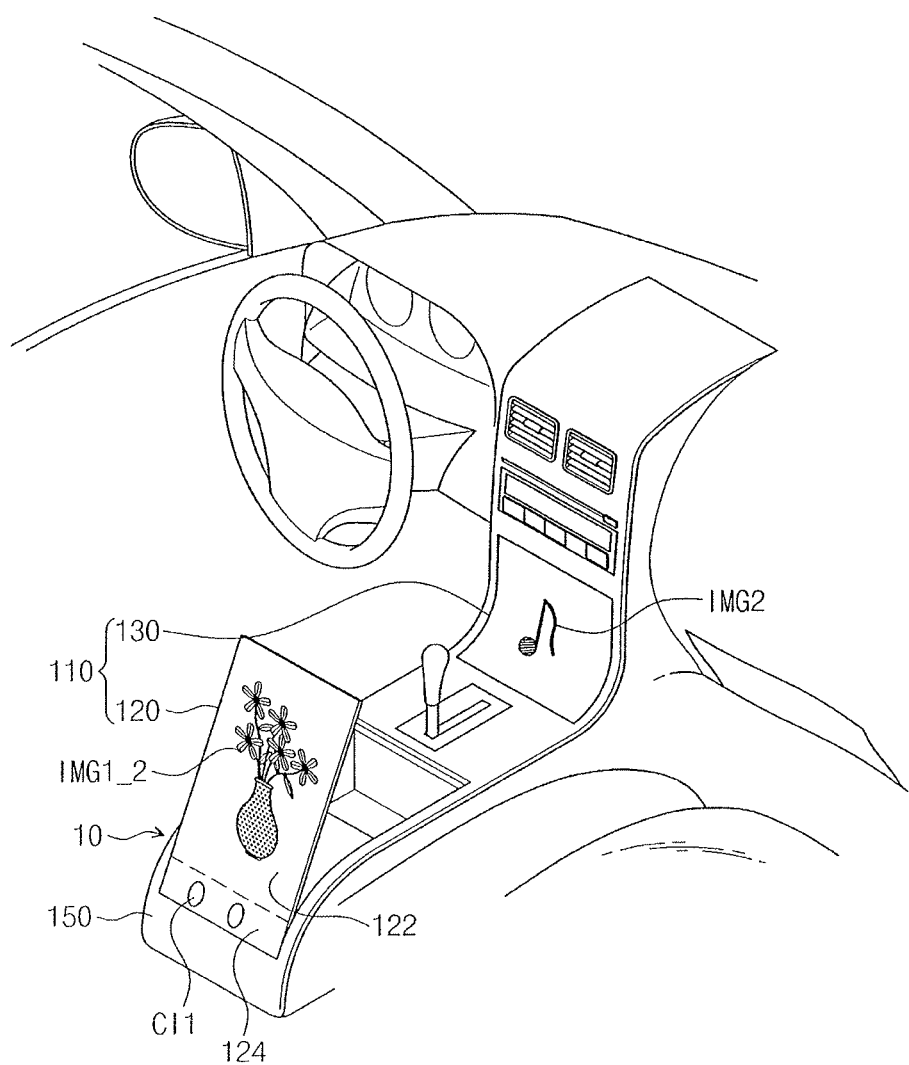

FIGS. 3D, 3E, and 3F illustrate perspective views of an automotive display device according to an exemplary embodiment of the present disclosure.

Various elements of the vehicle, e.g., an air outlet of heater and air conditioner and a gear shift stick, shown in FIGS. 3A, 3D, 3E, and 3F may be integrally formed with the automotive display device or formed separate from the automotive display device and coupled to the automotive display device through coupling holes formed in the automotive display device.

Referring to FIGS. 3A, 3D, 3E, and 3F, the first flexible display device 120 may be bent with respect to a first bending axis BX1. The first flexible display device 120 may be bent to have a first radius of curvature R1.

The first flexible display device 120 may display first images IMG1_1 and IMG1_2. The first display images IMG1_1 and IMG1_2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

The first flexible display device 120 may display the first display images IMG1_1 and IMG1_2 at one or more of a state when the first flexible display device 120 is bent with respect to the first bending axis BX1 and a state when the first flexible display device 120 is unbent with respect to the first bending axis BX1.

Referring to FIG. 3D, the first flexible display device 120 may display a first sub-image IMG1_1 when being bent with respect to the first bending axis BX1 (refer to FIG. 3A). The first sub-image IMG1_1 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

Referring to FIGS. 3E and 3F, the first flexible display device 120 may display a second sub-image IMG1_2 when being unbent with respect to the first bending axis BX1 (refer to FIG. 3A). The first flexible display device 120 may display the first display images IMG1_1 and IMG1_2 while being unbent. The second sub-image IMG1_2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie. The second sub-image IMG1_2 may be substantially the same as or may be different from the first sub-image IMG1_1 (refer to FIG. 3D).

Referring to FIGS. 3A and 3D, when the first flexible display device 120 is bent, both ends of the first flexible display device 120 may contact the non-display frame 150. Referring to FIGS. 3E and 3F, when the first flexible display device 120 is unbent, one end of the first flexible display device 120 may contact the non-display frame 150 and the other end of the first flexible display device 120 may be spaced apart from the non-display frame 150 since the first flexible display device 110 is unbent with respect to the first bending axis BX1 (refer to FIG. 3A). In an embodiment, as shown in FIGS. 3E and 3F, the first flexible display device 120 may be completely unbent to be flat between the seats. The first flexible display device 120 may be partially unbent between the seats.

Referring to FIGS. 3A, 3D, 3E, and 3F, the first flexible display device 120 may include a first separation area 122 and a first fixing area 123. The first separation area 122 may be spaced apart from the non-display frame 150 when the first flexible display device 120 is unbent with respect to the first bending axis BX1. The first separation area 122 may display the first display images IMG1_1 and IMG1_2.

The first fixing area 124 may be disposed at one side of the first separation area 122. The first fixing area 124 may contact the non-display frame 150 when the first flexible display device 120 is unbent with respect to the first bending axis BX1. The first fixing area 124 may display at least one of the first display images IMG1_1 and IMG1_2 and a first control unit image CI1 used to control the first display images IMG1_1 and IMG1_2. For example, when the user or the object touches or proximity touches the first flexible display device 120, the first control unit image CI1 used to control the first display images IMG1_1 and IMG1_2 may be displayed in the first flexible display device 120. According to embodiments, the first control unit image CI1 may be displayed in the first flexible display device 120 regardless of the touch or proximity touch.

The first control unit image CI1 may be overlapped with the first display images IMG1_1 and IMG1_2 while being displayed. When the first control unit image CI1 is overlapped with the first display images IMG1_1 and IMG1_2 while being displayed, a portion of the first display images IMG1_1 and IMG1_2, which is overlapped with the first control unit image CI1, may become blurred.

The user may control sound, size, and contrast of the first display images IMG1_1 and IMG1_2 displayed through the first flexible display device 120 and the bending of the first flexible display device 120 by directly operating the first control unit image CI1 or operating the first control unit image CI1 through a tool. The user may control not only the first display images IMG1_1 and IMG1_2 displayed through the first flexible display device 120, but also elements of the vehicle, e.g., a sun visor, a window, and a back mirror, through the first control unit image CI1.

The first control unit image CI1 may be provided in a plural number. The first control unit images CI1 may generate vibrations with different intensities.

Referring to FIGS. 3A to 3F, the second flexible display device 130 may be spaced apart from the first flexible display device 120 and may be bent. The second flexible display device 130 may be maintained in the bending state without being unbent. The second flexible display device 130 may have a second radius of curvature R2 when being bent. In an embodiment, the second radius of curvature R2 may be different from the first radius of curvature R1. In an embodiment, the second radius of curvature R2 may be equal to the first radius of curvature R1.

The second flexible display device 130 may display a second display image IMG2. The second display image IMG2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie. The second display image IMG2 may be different from or the same as the first display images IMG1_1 and IMG1_2.

When the user or the object touches or proximity touches the second flexible display device 130, a second control unit image used to control the second display image IMG2 may be displayed in the second flexible display device 130. According to embodiments, the second control unit image may be displayed in the second flexible display device 130 regardless of the touch or proximity touch.

The second control unit image may be overlapped with the second display image IMG2 while being displayed. When the second control unit image is overlapped with the second display image IMG2 while being displayed, a portion of the second display image IMG2, which is overlapped with the second control unit image, may become blurred.

The user may control sound, size, and contrast of the second display image IMG2 displayed through the second flexible display device 130 and the bending of the second flexible display device 130 by directly operating the second control unit image or operating the second control unit image using a tool. The user may control not only the second display image IMG2 displayed through the second flexible display device 130, but also elements of the vehicle, e.g., a sun visor, a window, and a back mirror, through the second control unit image.

The second control unit image may be provided in a plural number. The second control unit images may generate vibrations with different intensities.

Figure 4A:
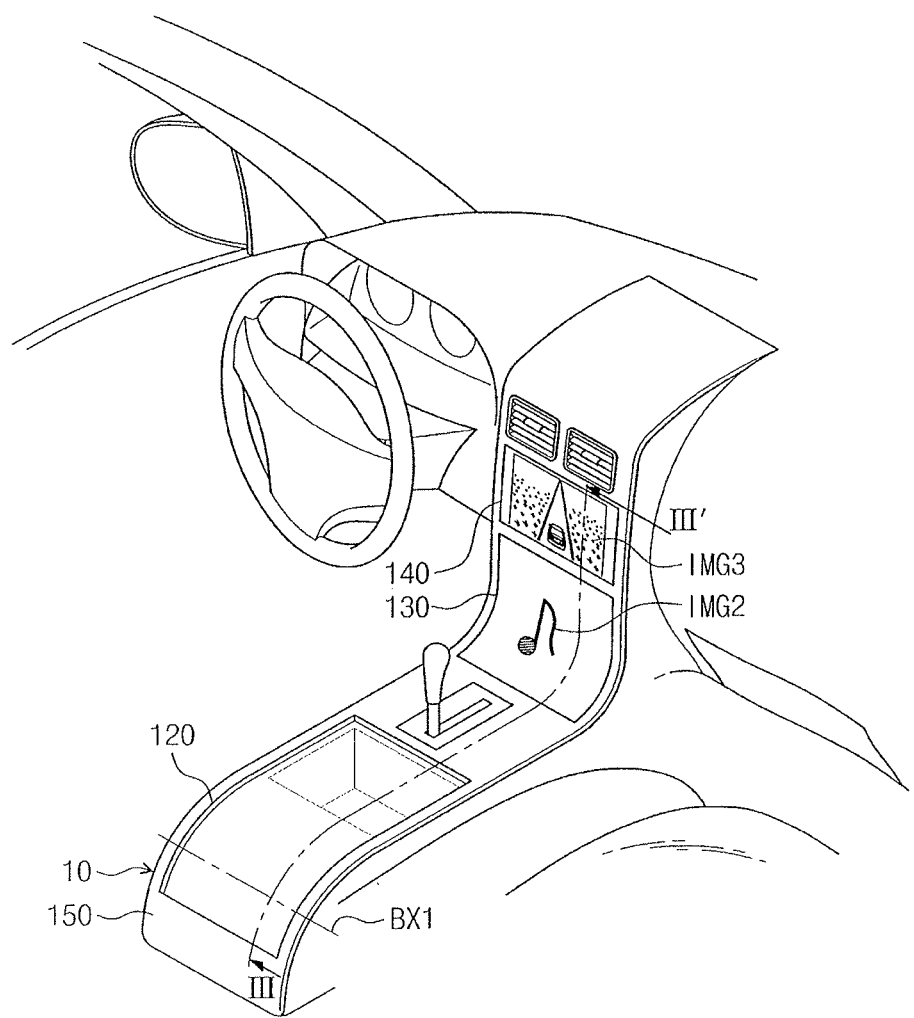
FIG. 4A illustrates a perspective view of an automotive display device according to an exemplary embodiment of the present disclosure.
Figure 4B:
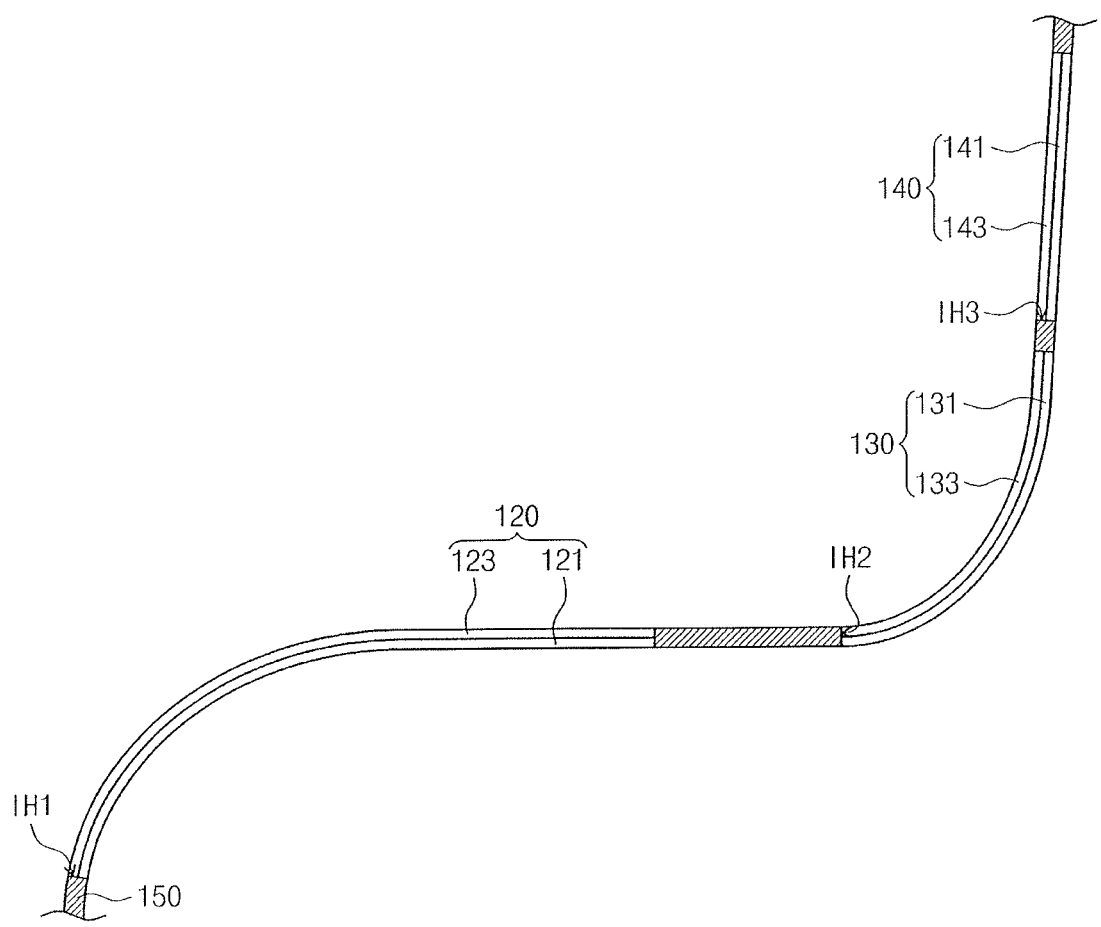
FIGS. 4B and 4C illustrate cross-sectional views each taken along a line III-HP of FIG. 4A.
Figure 4C:
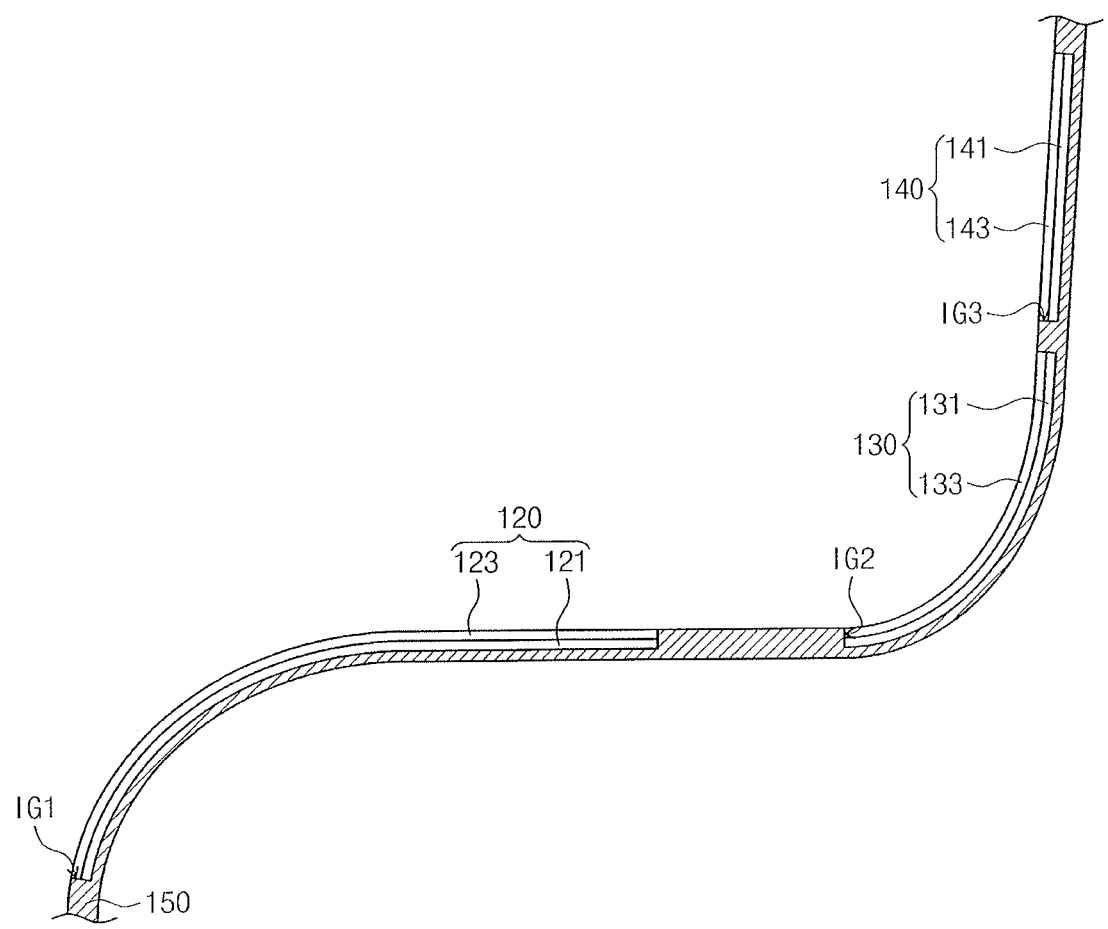
Figure 4D:
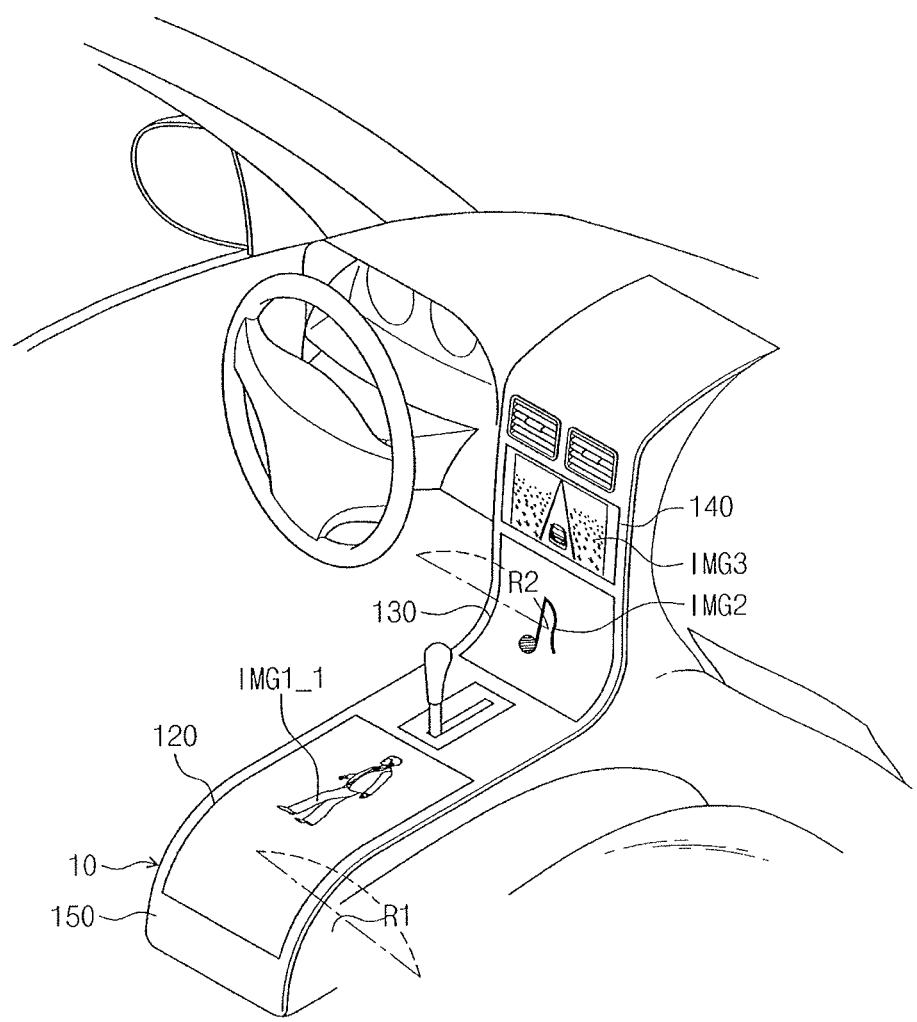
FIGS. 4D, 4E, and 4F illustrate perspective views of an automotive display device according to an exemplary embodiment of the present disclosure.
Figure 4E:
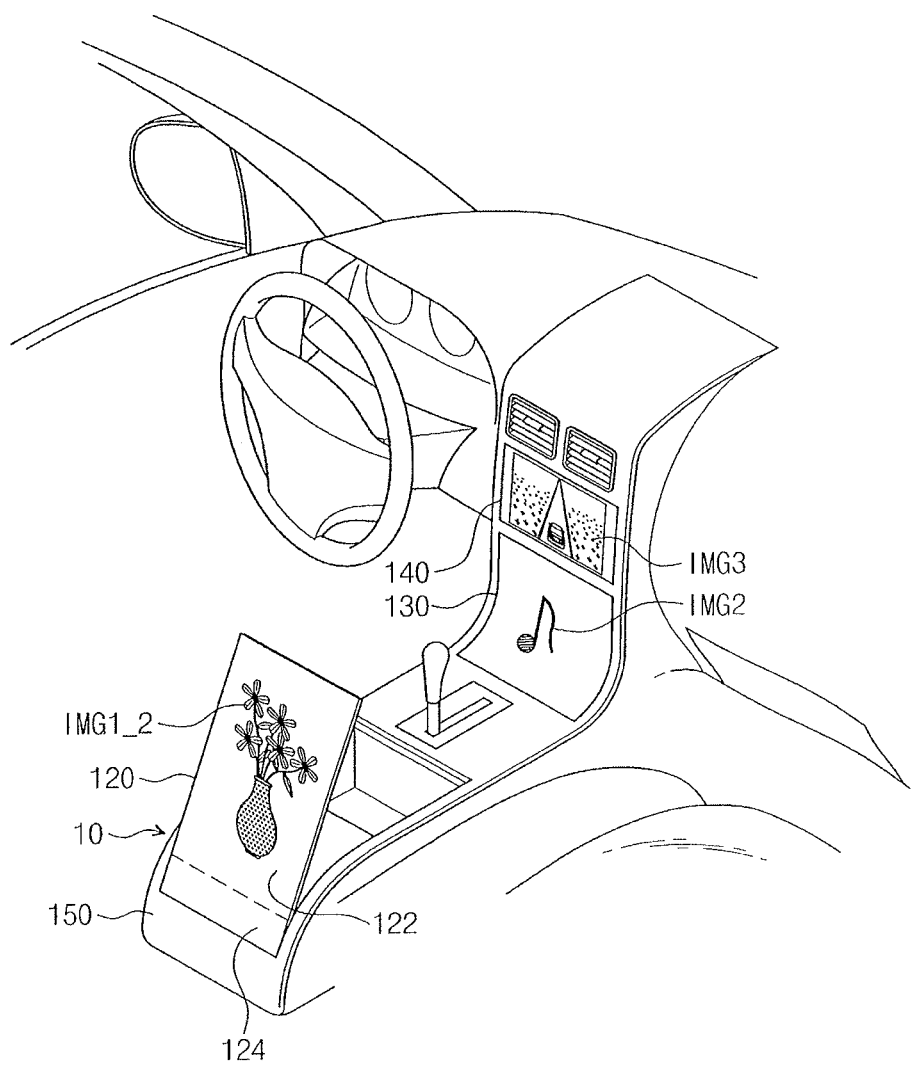
Figure 4F:
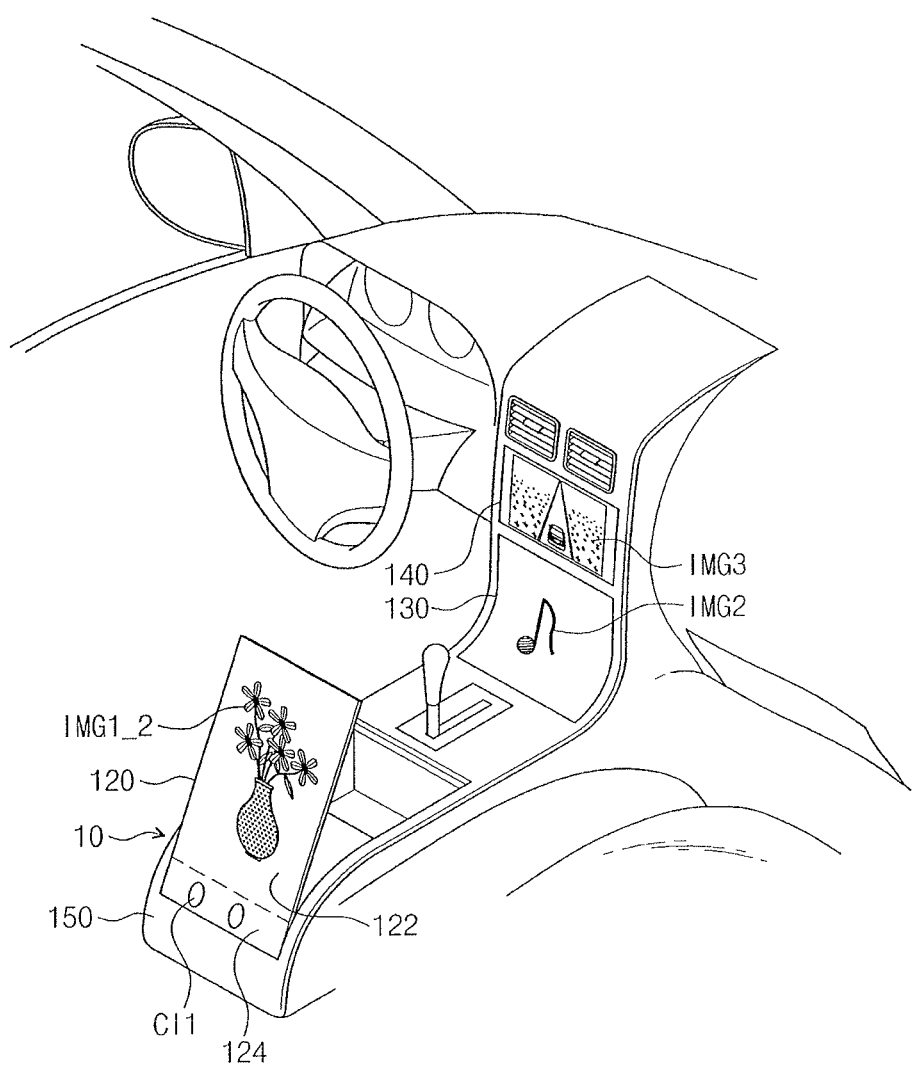

FIG. 4A illustrates a perspective view of an automotive display device according to an exemplary embodiment of the present disclosure, FIGS. 4B and 4C illustrate cross-sectional views each taken along a line III-III' of FIG. 4A, and FIGS. 4D, 4E, and 4F illustrate perspective views of an automotive display device according to an exemplary embodiment of the present disclosure.

Various elements of the vehicle, e. g., an air outlet of heater and air conditioner and a gear shift stick, shown in FIGS. 4A, 4D, 4E, and 4F may be integrally formed with the automotive display device or formed separate from the automotive display device and coupled to the automotive display device through coupling holes formed in the automotive display device.

Referring to FIGS. 4A to 4F, a flexible display device 110 may include a first flexible display device 120, a second flexible display device 130, and a third flexible display device 140. At least one of the first flexible display device, the second flexible display device, and third flexible display device 120, 130, and 140 may be maintained in the bending state without being unbent.

The first and second flexible display devices 120 and 130 shown in FIGS. 4A to 4F may have the same structure and function as those of the first and second flexible display devices 120 and 130 shown in FIGS. 3A to 3F, and hereinafter, different features of the flexible display device 110 will be mainly described.

The first flexible display device 120 may be bent with respect to the first bending axis BX1 and may have the first radius of curvature R1.

The first flexible display device 120 may display the first display images IMG1_1 and IMG1_2. The first flexible display device 120 may include the first separation area 122 and the first fixing area 124. The first separation area 122 may be spaced apart from the non-display frame 150 when the first flexible display device 120 is unbent with respect to the first bending axis BX1. The first separation area 122 may display the first display images IMG1_1 and IMG1_2.

The first fixing area 124 may be disposed at one side of the first separation area 122. The first fixing area 124 may contact the non-display frame 150 when the first flexible display device 120 is unbent with respect to the first bending axis BX1. The first fixing area 124 may display at least one of the first display images IMG1_1 and IMG1_2 and the first control unit image CI1 used to control the first display images IMG1_1 and IMG1_2.

The second flexible display device 130 may be spaced apart from the first flexible display device 120 and may be bent. The second flexible display device 130 may be maintained in the bending state without being unbent. The second flexible display device 130 may have the second radius of curvature R2 when being bent. The second flexible display device 130 may display the second display image IMG2.

The third flexible display device 140 may be spaced apart from each of the first and second flexible display devices 120 and 130. The third flexible display device 140 may be maintained in the bending state while being bent, or may be maintained in the flat state without being bent.

Referring to FIGS. 4B and 4C, the third flexible display device 140 may include a third flexible display panel 141 and a third touch screen panel 143. The third flexible display panel 141 may be transparent to allow a user to see an object disposed above or under the third flexible display panel 141. According to embodiments, the third flexible display panel 141 may not be transparent.

The third touch screen panel 143 may be disposed on the third flexible display panel 141. The third touch screen panel 143 may recognize a user's touch, a user's proximity touch, an object's touch, or an object's proximity touch.

In FIGS. 4B and 4C, the third flexible display device 140 may include the third touch screen panel 143. According to embodiments, the third flexible display device 140 may not include the third touch screen panel 143.

The non-display frame 150 may surround the first flexible display device, the second flexible display device, and third flexible display device 120, 130, and 140. In the present exemplary embodiment, the non-display frame 150 may be integrally formed as a single unit to surround the first flexible display device, the second flexible display device, and third flexible display device 120, 130, and 140. In an embodiment, the non-display frame 150 may include a plurality of sub-non-display frames, one sub-non-display frame of the sub-non-display frames may surround the first flexible display device 120, another sub-non-display frame of the sub-non-display frames may surround the second flexible display device 130, and the other sub-non-display frame of the sub-non-display frames may surround the third flexible display device 140. In an embodiment, one sub-non-display frame of the sub-non-display frames may surround the first flexible display device 120 and the other sub-non-display frame of the sub-non-display frames may surround the second and third flexible display devices 130 and 140. The sub-non-display frames may be connected to or separated from each other.

When at least one of the first flexible display device, the second flexible display device, and third flexible display device 120, 130, and 140 is unbent, at least a portion of the sub-non-display frames may be unbent.

Referring to FIG. 4B, the non-display frame 150 may include a first hole IH1, a second hole IH2, and a third hole IH3. The first flexible display device 120 may be disposed in the first hole IH1, the second flexible display device 130 may be disposed in the second hole IH2, and the third flexible display panel 141 may be disposed in the third hole IH3.

The non-display frame 150 may have substantially the same thickness as the first flexible display device, the second flexible display device, and third flexible display device 120, 130, and 140. At least one of the non-display frame 150, the first flexible display device 120, the second flexible display device 130, and the third flexible display device 140 may have a thickness different from those of others.

Referring to FIG. 4C, the non-display frame 150 may include a first groove IG1, a second groove IG2, and a third groove IG3. The first flexible display device 120 may be inserted into the first groove IG1, the second flexible display device 130 may be inserted into the second groove IG2, and the third flexible display device 140 may be inserted into the third groove IG3. In an embodiment, as shown in FIG. 4C, the first flexible display device 120 may be completely inserted into the first groove IG1, the second flexible display device 130 may be completely inserted into the second groove IG2, and the third flexible display device 140 may be completely inserted into the third groove IG3. In an embodiment, the first flexible display device 120 may be partially inserted into the first groove IG1, the second flexible display device 130 may be partially inserted into the second groove IG2, and the third flexible display device 140 may be partially inserted into the third groove IG3.

Referring to FIGS. 4B and 4C, the first flexible display device, the second flexible display device, and third flexible display device 120, 130, and 140 may be disposed in various ways different from that shown in FIGS. 4B and 4C. For example, the first flexible display device 120 may be disposed in the first hole IH1, the second flexible display device 130 may be inserted into the second groove IG2, and the third flexible display device 140 may be disposed in the third hole IH3. The first flexible display device 120 may be inserted into the first groove IG1, the second flexible display device 130 may be disposed in the second hole IH2, and the third flexible display device 140 may be disposed in the third hole IH3.

Referring to FIGS. 4A to 4F, the third flexible display device 140 may display a third display image IMG3. The third display image IMG3 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

When the user or the object touches or proximity touches the third flexible display device 140, a third control unit image used to control the third display image IMG3 may be displayed in the third flexible display device 140. According to embodiments, the third control unit image may be displayed in the third flexible display device 140 regardless of the touch or proximity touch.

The third control unit image may be overlapped with the third display image IMG3 while being displayed. When the third control unit image is overlapped with the third display image IMG3 while being displayed, a portion of the third display image IMG3, which is overlapped with the third control unit image, may become blurred.

The user may control sound, size, and contrast of the third display image IMG3 displayed through the third flexible display device 140 and the bending of the third flexible display device 140 by directly operating the third control unit image or operating the third control unit image using a tool. The user may control not only the third display image IMG3 displayed through the third flexible display device 140, but also elements of the vehicle, e.g., a sun visor, a window, and a back mirror, through the third control unit image.

The third control unit image may be provided in a plural number. The third control unit images may generate vibrations with different intensities.

FIGS. 5A, 5B, 5C, and 5D illustrate perspective views of an automotive display device according to an exemplary embodiment of the present disclosure.

Hereinafter, different features of first, second, and third flexible display devices 120, 130, and 140 shown in FIGS. 5A to 5D from those of the first flexible display device, the second flexible display device, and third flexible display device 120, 130, and 140 shown in FIGS. 4A to 4F will be mainly described in detail.

Various elements of the vehicle, e.g., an air outlet of heater and air conditioner and a gear shift stick, may be integrally formed with the automotive display device or formed separate from the automotive display device and coupled to the automotive display device through coupling holes formed in the automotive display device.

Referring to FIGS. 5A to 5D, the first flexible display device 120 may be bent with respect to a first bending axis BX1. The first flexible display device 120 may be bent to have a first radius of curvature R1.

The first flexible display device 120 may display first display images IMG1_1 and IMG1_2. The first flexible display device 120 may include a first separation area 122 and a first fixing area 124. The first separation area 122 may be spaced apart from the non-display frame 150 when the first separation area 122 is bent with respect to the first bending axis BX1. The first separation area 122 may display the first display images IMG1_1 and IMG1_2.

The first fixing area 124 may be disposed at one side of the first separation area 122. The first fixing area 124 may contact the non-display frame 150 when the first flexible display device 120 is unbent with respect to the first bending axis BX1. The first fixing area 124 may display at least one of the first display images IMG1_1 and IMG1_2 and a first control unit image CI1 used to control the first display images IMG1_1 and IMG1_2.

The second flexible display device 130 may be spaced apart from the first flexible display device 120 and may be bent. The second flexible display device 130 may be maintained in the bending state without being unbent. The second flexible display device 130 may have a second radius of curvature R2 when being bent. The second flexible display device 130 may display a second display image IMG2.

Referring to FIGS. 5A to 5D, the third flexible display device 140 may be bent with respect to a second bending axis BX2. The second bending axis BX2 may be substantially parallel to the first bending axis BX1. The third flexible display device 140 may be bent to have a third radius of curvature R3. The third radius of curvature R3 may be different from the first and second radius of curvatures R1 and R2. According to embodiments, the third radius of curvature R3 may be substantially the same as the first and second radius of curvatures R1 and R2.

The third flexible display device 140 may display third images IMG3_1 and IMG3_2. The third images IMG3_1 and IMG3_2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

Referring to FIGS. 5A to 5D, the third flexible display device 140 may display the third images IMG3_1 and IMG3_2 at one or more of a state when the third flexible display device 140 is bent with respect to the second bending axis BX2 and a state when the third flexible display device 140 is unbent with respect to the second bending axis BX2.

Figure 5A:
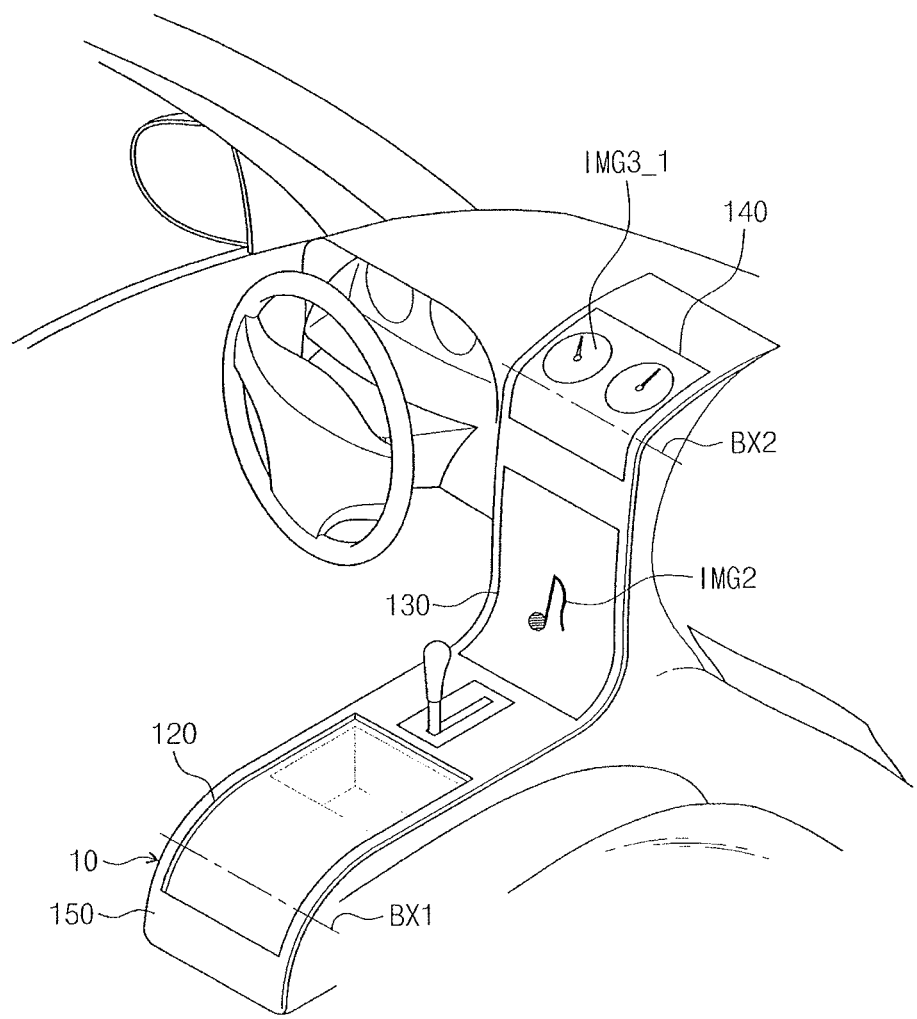
FIGS. 5A, 5B, 5C, and 5D illustrate perspective views of an automotive display device according to an exemplary embodiment of the present disclosure.
Figure 5B:
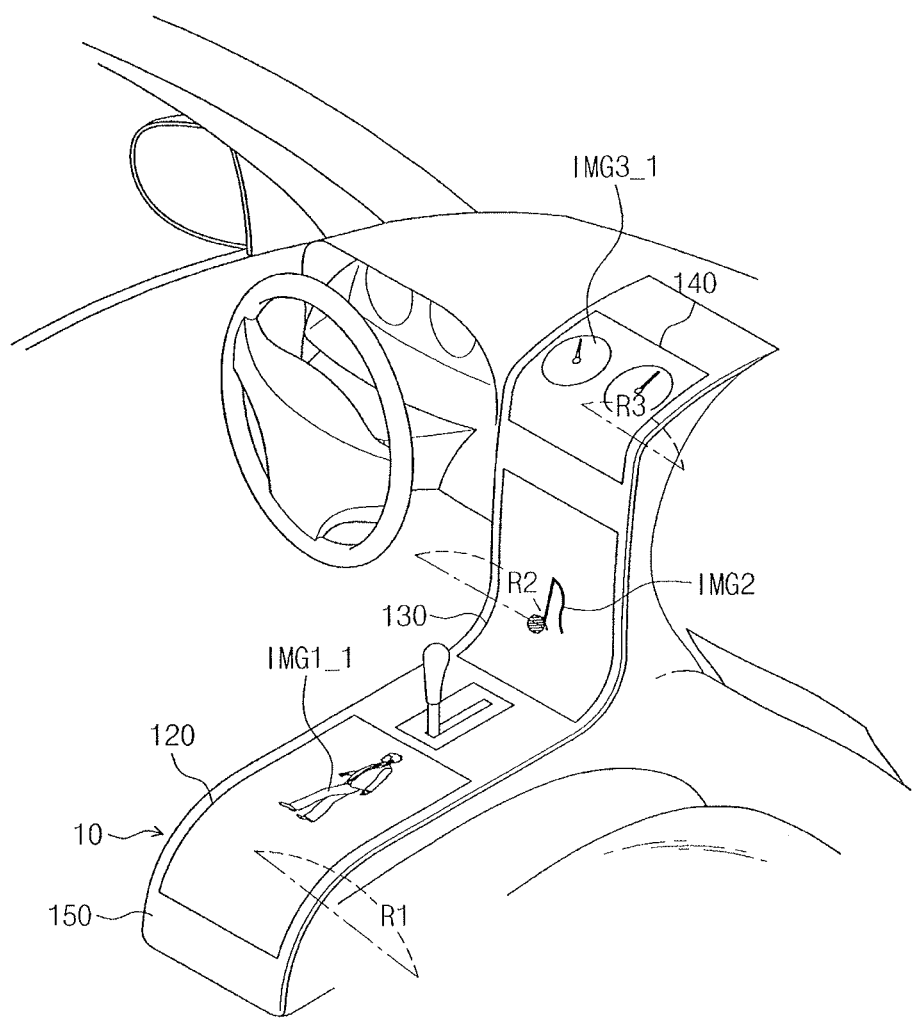

Referring to FIG. 5B, the third flexible display device 140 may display a third sub-image IMG3_1 when being bent with respect to the second bending axis BX2 (refer to FIG. 5A). The third sub-image IMG3_1 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie.

Figure 5C:
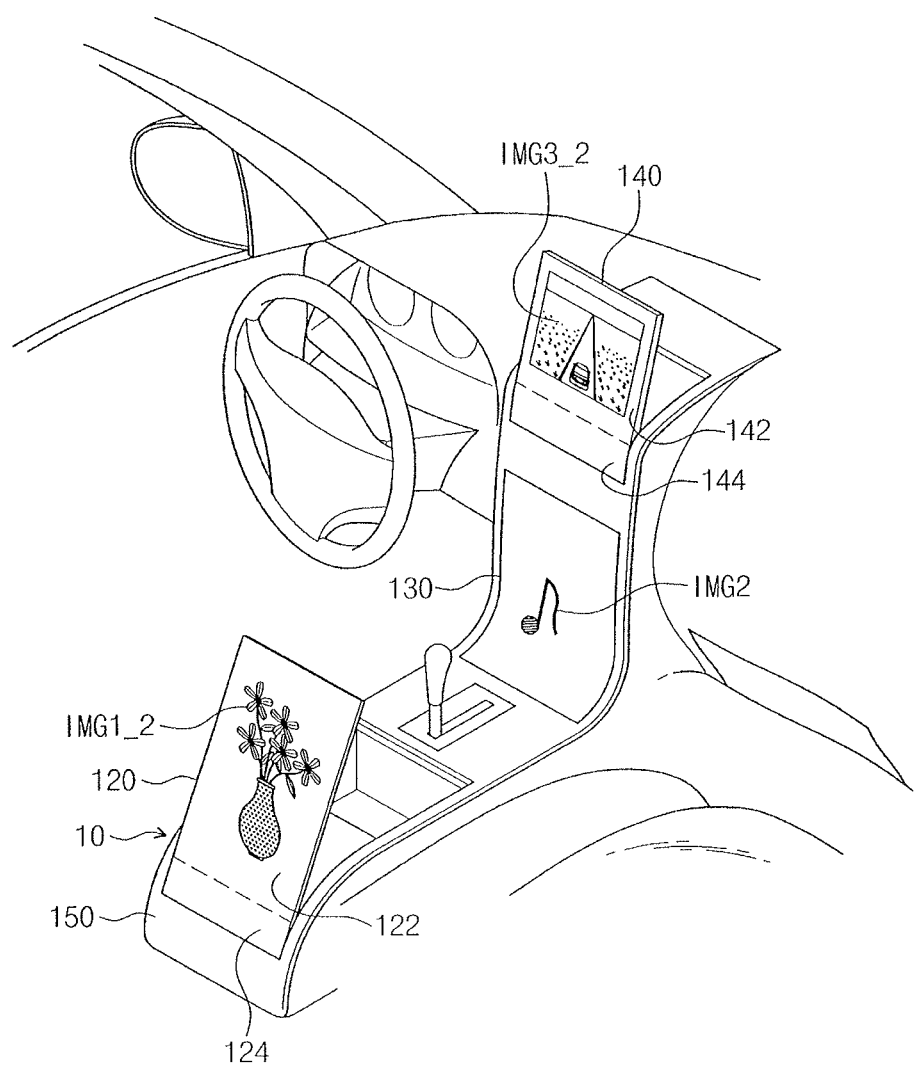
Figure 5D:
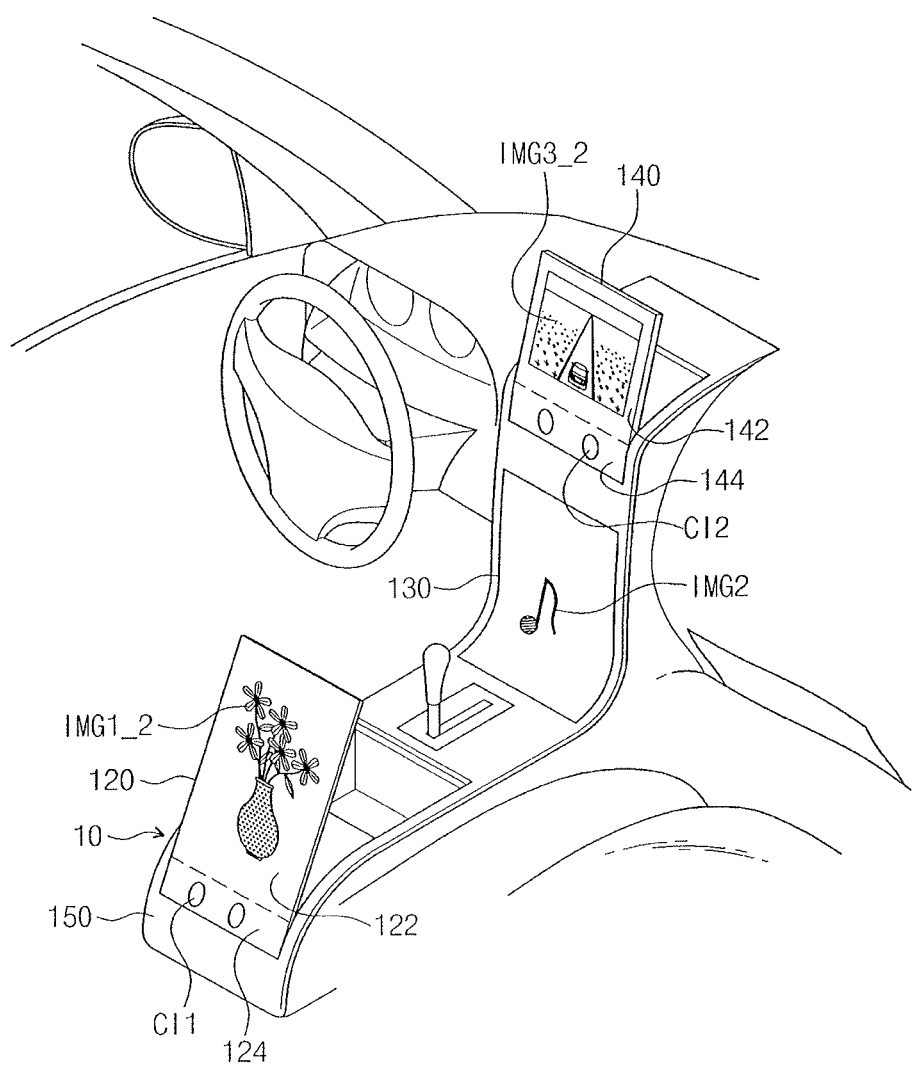

Referring to FIGS. 5C and 5D, the third flexible display device 140 may display a fourth sub-image IMG3_2 when being unbent with respect to the second bending axis BX2 (refer to FIG. 5A). The third flexible display device 140 may display the third images IMG3_1 and IMG3_2 while being unbent. The fourth sub-image IMG3_2 may include information of the vehicle, such as, for example, miles per hour of the vehicle and inside temperature of the vehicle, external information of the vehicle, such as, for example, outside temperature of the vehicle and outside humidity of the vehicle, navigation information, driving related information, navigational information, and multimedia information, such as, for example, music, a game, TV, and a movie. The fourth sub-image IMG3_2 may be substantially the same as or may be different from the third sub-image IMG3_1 (refer to FIG. 5B).

Referring to FIGS. 5A and B, when the third flexible display device 130 is bent, both ends of the third flexible display device 130 may contact the non-display frame 150. Referring to FIGS. 5C and 5D, when the third flexible display device 140 is unbent, one end of the third flexible display device 140 may contact the non-display frame 150 and the other end of the third flexible display device 140 may be spaced apart from the non-display frame 150 since the third flexible display device 140 is unbent with respect to the second bending axis BX2. In an embodiment, as shown in FIGS. 5C and 5D, the third flexible display device 140 may be completely unbent to be flat between the seats. The third flexible display device 140 may be partially unbent between the seats.

Referring to FIGS. 5A to 5D, the third flexible display device 120 may include a second separation area 142 and a second fixing area 144. The first separation area 142 may be spaced apart from the non-display frame 150 when the third flexible display device 140 is unbent with respect to the second bending axis BX2. The second separation area 142 may display the third images IMG3_1 and IMG3_2 (refer to FIG. 5B).

The second fixing area 144 may be disposed at one side of the second separation area 142. The second fixing area 144 may contact the non-display frame 150 when the third flexible display device 140 is unbent with respect to the second bending axis BX2. The second fixing area 144 may display at least one of the third images IMG3_1 and IMG3_2 and a third control unit image CI2 used to control the third images IMG3_1 and IMG3_2. For example, when the user or the object touches or proximity touches the third flexible display device 140, the third control unit image CI2 used to control the third images IMG3_1 and IMG3_2 may be displayed in the third flexible display device 140. According to embodiments, the third control unit image CI2 may be displayed in the third flexible display device 140 regardless of the touch or proximity touch.

The third control unit image CI2 may be overlapped with the third display images IMG3_1 and IMG3_2 while being displayed. When the third control unit image CI2 is overlapped with the third images IMG3_1 and IMG3_2 while being displayed, a portion of the third display images IMG3_1 and IMG3_2, which is overlapped with the third control unit image CI2, may become blurred.

The user may control sound, size, and contrast of the third images IMG3_1 and IMG3_2 displayed through the third flexible display device 140 and the bending of the third flexible display device 140 by directly operating the third control unit image CI2 or operating the third control unit image CI2 through a tool. The user may control not only the third images IMG3_1 and IMG3_2 displayed through the third flexible display device 140, but also elements of the vehicle, e.g., a sun visor, a window, and a back mirror, through the third control unit image CI2.

The third control unit image CI2 may be provided in a plural number. The third control unit images CI2 may generate vibrations with different intensities.

By way of summation and review, provided is an automotive display device that may be capable of providing various image information oriented towards comfort and convenience of a passenger in a vehicle.

The automotive display device may be applied to the vehicle and may display various images while being bent or unbent in consideration of convenience of the passenger. Thus, the passenger may have various image information when the passenger uses the vehicle.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An automotive display device on which an image may be displayed into a vehicle interior, the automotive display device comprising:
    a display frame that includes a flexible display, at least part of the display frame being bendable; and
    a bending controller to control bending of the display frame,
    wherein the flexible display includes:
        a first flexible display that is bendable; and
        a second flexible display spaced apart from the first flexible display, the second flexible display being bendable, and
    wherein one of the first flexible display and the second flexible display is bent to have a convex curvature toward a user, and another one is bent to have concave curvature from the user.

2. The automotive display device as claimed in claim 1, wherein:
    the first flexible display is closer to the user than to the second flexible display,
    the first flexible display is bent to have the convex curvature, and
    the second flexible display is bent to have the concave curvature.

3. The automotive display device as claimed in claim 1, wherein:
    the first flexible display is closer to the user than to the second flexible display,
    the first flexible display is bent to have the concave curvature, and
    the second flexible display is bent to have the convex curvature.

4. The automotive display device as claimed in claim 1, wherein:
    the first flexible display has a first radius of curvature, and
    the second flexible display has a second radius of curvature different from the first radius of curvature.

5. The automotive display device as claimed in claim 1, wherein the flexible display further includes a third flexible display spaced apart from each of the first and second flexible displays, the third flexible display being bendable.

6. The automotive display device as claimed in claim 5, wherein:
    the first flexible display is bent to have the convex curvature,
    the second flexible display is bent to have the concave curvature, and
    the third flexible display is bent to have the convex curvature.

7. The automotive display device as claimed in claim 5, wherein:
    the first flexible display is bent to have the concave curvature,
    the second flexible display is bent to have the convex curvature, and
    the third flexible display is bent to have the concave curvature.

8. The automotive display device as claimed in claim 5, wherein at least one of the first flexible display, the second flexible display, and the third flexible display is maintained in a bent state.

9. The automotive display device as claimed in claim 1, wherein the second flexible display is maintained in a bent state.

10. The automotive display device as claimed in claim 1, wherein:
    the display frame includes a non-display frame surrounding the flexible display,
    a first end of the first flexible display contacts the non-display frame, and a second end of the first flexible display is spaced apart from the non-display frame when the first flexible display is unbent with respect to a first bending axis.

11. The automotive display device as claimed in claim 1, the display frame includes a non-display frame surrounding the flexible display, and the non-display frame is integrally formed as a single unit to surround the first flexible display and the second flexible display.

12. The automotive display device as claimed in claim 1, wherein:

the display frame includes a non-display frame surrounding the flexible display, the non-display frame includes a first hole and a second hole, the first flexible display is disposed in the first hole, the second flexible display is in the second hole.

13. An automotive display device on which an image may be displayed into a vehicle interior, the automotive display device comprising:

a display frame including a flexible display, at least part of the display frame being bendable, wherein the flexible display includes:

a first flexible display that is bendable; an a second flexible display spaced apart from the first flexible display, the second flexible display being bendable; and wherein one of the first flexible display and the second flexible display is bent to have a convex curvature toward a user, and the other is bent to have concave curvature from the user when it is bent.

14. The automotive display device as claimed in claim 13, wherein the flexible display further includes a third flexible display spaced apart from each of the first and second flexible displays, the third flexible display being bendable.

15. The automotive display device as claimed in claim 14, wherein at least one of the first flexible display, the second flexible display, and the third flexible display is maintained in a bent state.

16. The automotive display device as claimed in claim 13, wherein:

the display frame includes a non-display frame surrounding the flexible display, a first end of the first flexible display contacts the non-display frame, and a second end of the first flexible display is spaced apart from the non-display frame when the first flexible display is unbent with respect to a first bending axis.

* * * * *